United States Patent
Aritome

(10) Patent No.: US 9,153,330 B2
(45) Date of Patent: Oct. 6, 2015

(54) SEMICONDUCTOR SYSTEM AND METHOD OF OPERATING THE SAME

(71) Applicant: SK hynix Inc., Icheon-si Gyeonggi-do (KR)

(72) Inventor: Seiichi Aritome, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/311,506

(22) Filed: Jun. 23, 2014

(65) Prior Publication Data
US 2015/0221379 A1    Aug. 6, 2015

(30) Foreign Application Priority Data
Feb. 3, 2014    (KR) .................. 10-2014-0012203

(51) Int. Cl.
*G11C 16/04*    (2006.01)
*G11C 16/14*    (2006.01)
*G11C 16/26*    (2006.01)

(52) U.S. Cl.
CPC ............ *G11C 16/14* (2013.01); *G11C 16/0483* (2013.01); *G11C 16/26* (2013.01)

(58) Field of Classification Search
CPC .......................... G11C 16/0483; G11C 16/10
USPC ........................................ 365/185.11, 185.17
See application file for complete search history.

(56) References Cited

U.S. PATENT DOCUMENTS

2014/0301144 A1*  10/2014  Maejima et al. ......... 365/185.11
2015/0029790 A1*  1/2015   Nam et al. ............... 365/185.11

* cited by examiner

*Primary Examiner* — Huan Hoang
(74) *Attorney, Agent, or Firm* — William Park & Associates Ltd.

(57) ABSTRACT

A semiconductor system includes a data storage unit including memory blocks, a circuit group and a control circuit, wherein the memory blocks store data therein and are arranged in a longitudinal direction and a vertical direction. The circuit group is suitable for performing a program, read or erase operation on the memory blocks, and the control circuit controls the circuit group. A memory control unit is suitable for controlling the data storage unit, wherein each of the memory blocks includes a plurality of sub-memory blocks. The sub-memory blocks arranged in the longitudinal direction share bit lines and do not share word lines and source lines. Further, the sub-memory arranged in the vertical direction share the bit lines or the source lines.

20 Claims, 6 Drawing Sheets

SEMICONDUCTOR SYSTEM AND METHOD OF OPERATING THE SAME

CROSS-REFERENCE TO RELATED APPLICATIONS

The present application claims priority of Korean patent application number 10-2014-0012203, filed on Feb. 3, 2014, the entire disclosure of which is incorporated herein by reference in its entirety.

BACKGROUND

A semiconductor memory device that includes cell strings arranged in a longitudinal direction to a semiconductor substrate may be referred to as a three-dimensional semiconductor memory device. For example, in a three-dimensional semiconductor memory device, a source line may be arranged over a semiconductor substrate; a source selection transistor, a plurality of memory cells and a drain selection transistor may be stacked over the source line; and a bit line may be arranged over the drain selection transistor.

SUMMARY

An embodiment of the invention provides a semiconductor system, which may include a data storage unit including memory blocks, a circuit group and a control circuit. The memory blocks store data therein and are arranged in a longitudinal direction and a vertical direction. The circuit group is suitable for performing a program, read or erase operation on the memory blocks, and the control circuit controls the circuit group. A memory control unit is suitable for controlling the data storage unit, wherein each of the memory blocks includes a plurality of sub-memory blocks, the sub-memory blocks arranged in the longitudinal direction share bit lines and do not share word lines and source lines. In addition, the sub-memory blocks arranged in the vertical direction share the bit lines or the source lines.

An embodiment of the invention provides a method of operating a semiconductor system during an erase operation of the semiconductor system including memory blocks arranged in a longitudinal direction and a vertical direction and including first sub-memory blocks and second sub-memory blocks. The method may include increasing a voltage difference between a channel and memory cells of the first sub-memory block of a selected memory block to erase the memory cells included in the first sub-memory block of the selected memory block. The method may also include reducing a voltage difference between a channel and memory cells of the second sub-memory block of the selected memory block when the memory cells of the first sub-memory block are erased to not erase the memory cells included in the second sub-memory block of the selected memory.

In an embodiment of the invention, a semiconductor system includes a plurality of memory blocks configured to store data and be arranged in a longitudinal direction and a vertical direction. Each of the plurality of memory blocks include a plurality of sub-memory blocks in which the plurality of sub-memory blocks configured in the longitudinal direction share bit lines and do not share word lines and source lines. Further, the plurality of sub-memory blocks configured in the vertical direction share bit lines or source lines. The semiconductor system also includes a memory control unit configured to control the plurality of memory blocks.

DETAILED DESCRIPTION

Figure 1:
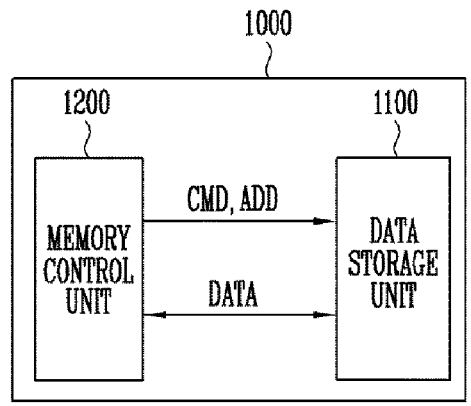
FIG. 1 is a schematic block diagram illustrating a semiconductor system according to an embodiment of the invention.

Various embodiments of the invention will be described with reference to the accompanying figures in detail. However, the scope of the invention is not limited to the various embodiments disclosed. Rather, the various embodiments are provided for full disclosure of the invention and to transfer the spirit of the invention to those skilled in the art. The scope of the invention should be understood as defined by the claims. Throughout the disclosure, reference numerals correspond directly to numbered parts in the various figures and embodiments. It is also noted that in the specification, "connected/coupled" refers to one component not only directly coupling to another component. In addition, "connected/coupled" also indirectly refers to coupling another component through an intermediate component. In addition, a singular form may include the plural form as long as it is not specifically mentioned. Since the plurality of memory blocks arranged in a longitudinal direction and a vertical direction share bit lines and a source line group, a reliability of an erase operation may be deteriorated and unnecessary power consumption may occur. Various embodiments relate to a semiconductor system capable of improving reliability of an erase operation and reducing power consumption. Moreover, various embodiments relate to dividing a selected memory block into two sub-memory blocks and separately erasing the sub-memory blocks, and a method of operating the same. According to the invention, the reliability of an erase operation of a three-dimensional semiconductor device may be improved, and unnecessary power consumption may be reduced.

Referring to FIG. 1, a semiconductor system according to an embodiment of the present invention is illustrated. The semiconductor system 1000 may include a data storage unit 1100 that stores data and a memory control unit 1200 that controls the data storage unit 1100. More specifically, when the memory storage 1200 receives a command signal, the memory storage 1200 may transfer an operation signal CMD and an address ADD that corresponds to the command signal to the data storage unit 1100. The data storage unit 1100 may perform a program, read or erase operation in response to the operation signal CMD and the address ADD. Further, the memory storage 1200 may receive data DATA, output from the data storage unit 1100, and also transfer the data DATA to an exterior device or the like.

Figure 2:
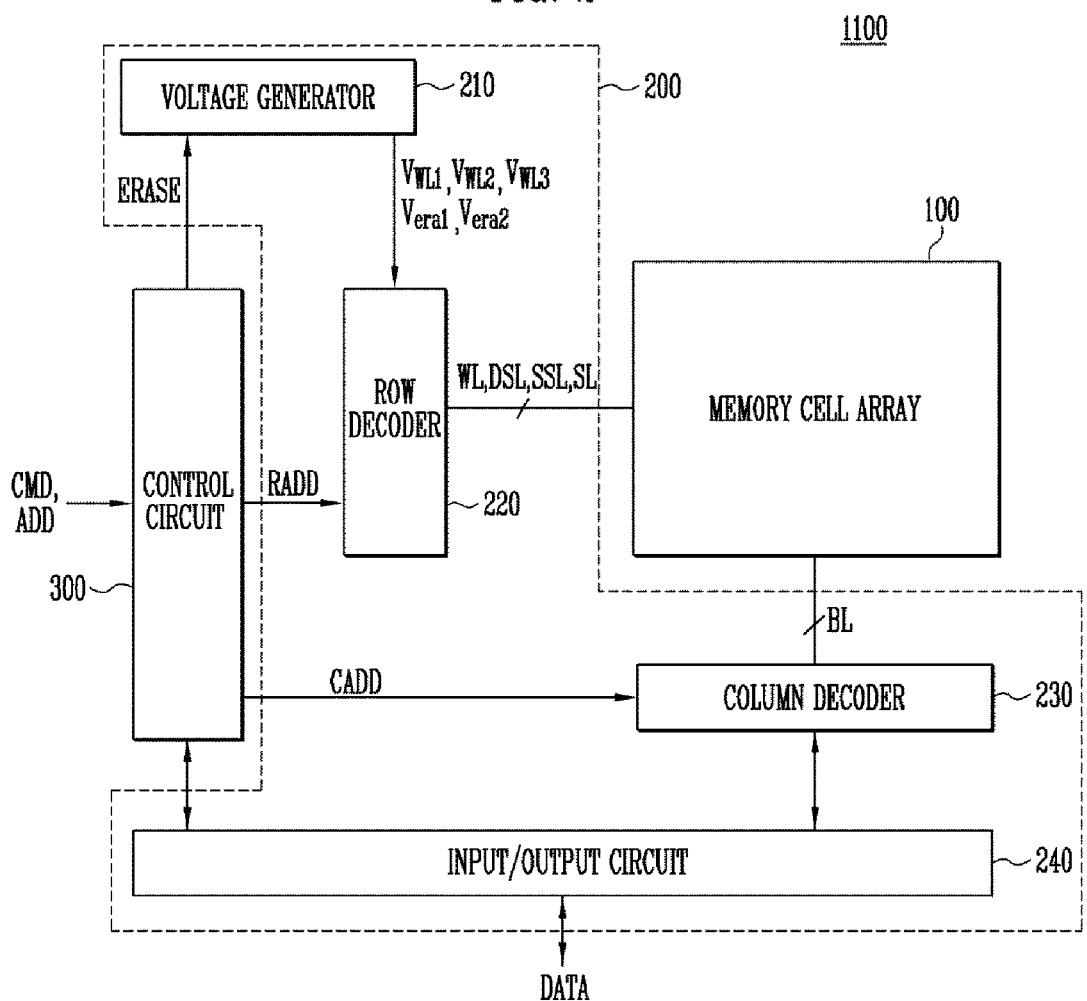
FIG. 2 is a block diagram illustrating a data storage unit shown in FIG. 1.

Referring to FIG. 2, a block diagram of the data storage unit shown in FIG. 1 is illustrated. The data storage unit 1100 may include a memory cell array 100 that stores data, a circuit group 200 that performs a program, read or erase operation. The data storage unit 1100 may also include a control circuit 300 that controls the circuit group 200.

The memory cell array 100 and the circuit group 200 will be described below.

The circuit group 200 may include a voltage generator 210, a row decoder 220, a column decoder 230. The circuit group 200 may also include an input/output circuit 240.

The voltage generator 210 may generate voltages having a plurality of levels in response to an operation signal. More specifically, when an erase operation signal ERASE is applied to the voltage generator 210, the voltage generator 210 may then generate erase voltages Veras1 and Veras2, an erase permission voltage $V_{WL1}$ and erase prohibition voltages $V_{WL2}$ and $V_{WL3}$. The voltage generator 210 may generate voltages applied to a drain selection line and a source selection line.

The row decoder 220 may transfer the voltages Veras1, Veras2, $V_{WL1}$, $V_{WL2}$ and $V_{WL3}$ generated by the voltage generator 210 to lines coupled to a selected memory block of the memory cell array 100 in response to a row address RADD. For instance, the row decoder 220 may transfer the erase voltages Veras1 and Veras2 to a source line group or bit lines. The row decoder 220 may also transfer the erase permission voltage $V_{WL1}$ to word lines of a selected sub-memory block in the selected memory block. Further, the row decoder 220 may transfer the erase prohibition voltages $V_{WL2}$ and $V_{WL3}$ to word lines unselected memory blocks and of an unselected sub-memory block.

The column decoder 230 may then exchange data through bit lines BL in response to a column address CADD.

The input/output circuit 240 may transfer the externally transferred data DATA to the column decoder 230. In the alternative, the input/output circuit 240 may transfer the data DATA, transferred from the column decoder 230, to the control circuit 300 to exterior.

The control circuit 300 may output various operating signals such as the erase operation signal ERASE, the row address RADD and the column address CADD, in response to the operation signal CMD and the address ADD. In an erase operation, the control circuit 300 may erase a first sub-memory block that is among sub-memory blocks included in the selected memory block. The control circuit 300 may also control the circuit group 200 to erase a second sub-memory block.

The memory cell array 100 will be described below in greater detail.

Figure 3:
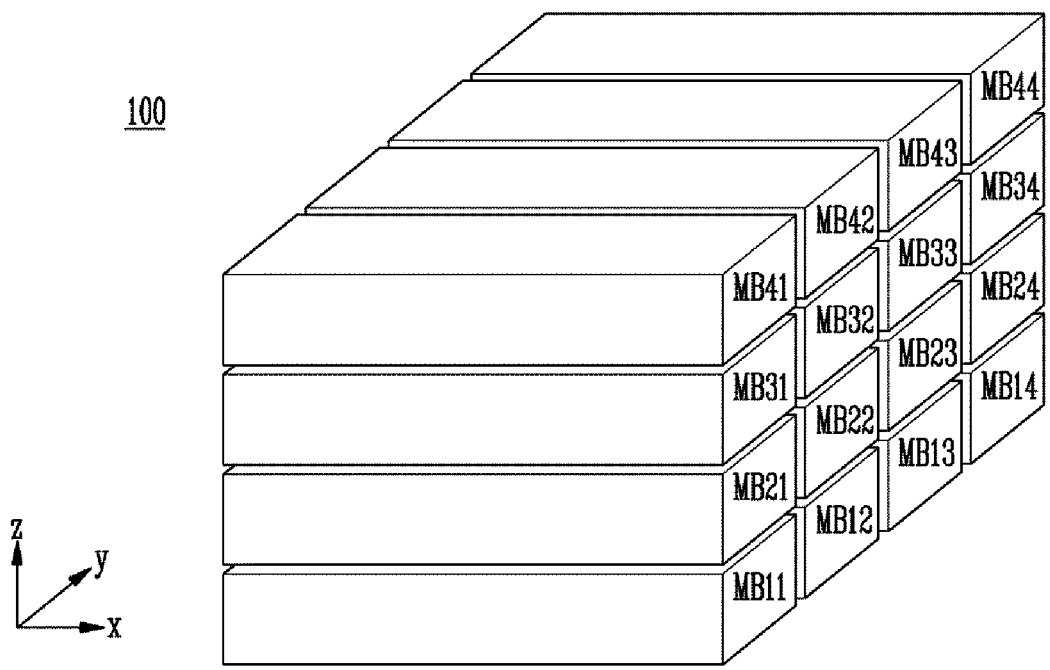
FIG. 3 is a three-dimensional diagram illustrating a memory cell array shown in FIG. 2.

Referring to FIG. 3, a three-dimensional view of the memory cell array shown in FIG. 2 is described. Moreover, it is described as an example that a semiconductor substrate is in a plane in a transverse direction X and a longitudinal direction Y. More specifically, memory cell blocks MB11 to MB44 may be arranged in the longitudinal direction Y and a vertical direction Z. For instance, the memory blocks MB11 to MB14 may be arranged in the longitudinal direction Y, and memory blocks MB11 to MB41, MB12 to MB42, MB13 to MB43 and MB14 to MB44 may correspondingly be stacked in the vertical direction Z.

Figure 4:
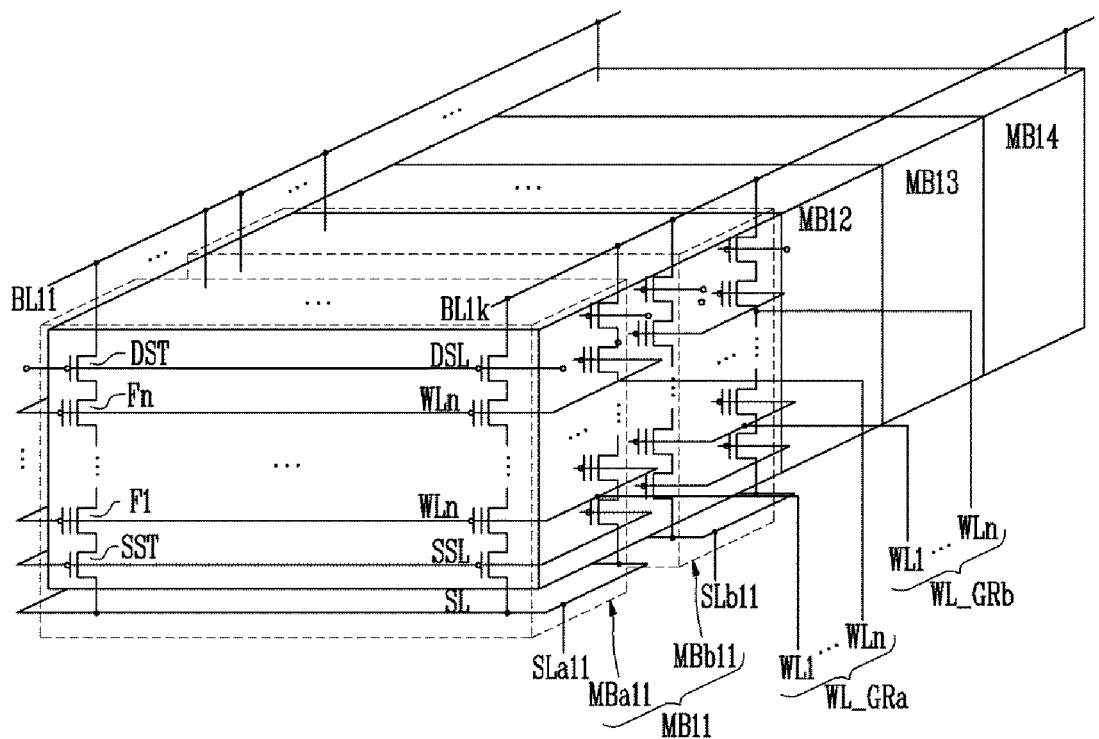
FIG. 4 is a detailed circuit diagram illustrating the configuration of memory blocks according to an embodiment of the invention.

Referring to FIG. 4 is a detailed circuit diagram illustrating the configuration of memory blocks according to an embodiment of the invention.

One of the plurality of memory blocks is described in detail with reference to FIG. 4.

A memory block may include one or more sub-memory blocks. For instance, the memory block MB11 may include a first sub-memory block MBa11 and a second sub-memory block MBb11. The first sub-memory block MBa11 and the second sub-memory block MBb11 may include a plurality of cell strings. Further, the cell strings may be divided into cells string groups in the longitudinal direction Y wherein the memory blocks MB11 to MB14 are arranged. One of the cell string groups may be defined as the first sub-memory block MBa11. In addition, another cell string group may be defined as the second sub-memory block MBb11.

The cell strings may include drain selection transistors DST, memory cells F1 to Fn and source selection transistors SST electrically coupled in series between source lines SL and bit lines BL11 to BL1k. The bit lines BL11 to BL1k may be electrically coupled to drains of the drain selection transistors DST. The source lines SL may be electrically coupled to sources of the source selection transistors SST. Gates of the drain selection transistors DST may be electrically coupled to drain selection lines DSL. Gates of the memory cells F1 to Fn may be electrically coupled to word lines WL1 to WLn. Gates of the source selection transistors SST may be electrically coupled to source selection lines SSL.

The first and second sub-memory blocks MBa11 and MBb11 are described below in further detail.

The first sub-memory block MBa11 may include a plurality of cell strings arranged in the transverse direction X and the longitudinal direction Y. The bit lines BL11 to BL1k may be electrically coupled to the cell strings arranged in the transverse direction X, and may be electrically coupled in common to the drain selection line DSL, the word lines WL1 to WLn, the source selection line SSL and the source line SL. The cell strings arranged in the longitudinal direction Y may be electrically coupled in common to one of the bit lines BL11 to BL1k. In addition, the cell strings in the longitudinal direction Y may be electrically coupled to one of the drain selection lines DSL, the word lines WL1 to WLn, one of the source selection lines SSL and the source lines SL.

In addition, memory cells that are included in the same page may be electrically coupled to the same word line. For instance, n-th memory cells Fn included in an n-th page of the first sub-memory block MBa11 may be electrically coupled in common to an n-th word line WLn. The n-th memory cells Fn included in the n-th page, may include the n-th memory cells Fn arranged in the transverse direction X. In addition, the n-th memory cells Fn may also include the longitudinal direction Y in the n-th page of the first sub-memory block MBa11. Word lines WL1 to WLn of the first sub-memory block MBa11 may be grouped into a first word line group WL_GRa. The source selection transistors SST in the first sub-memory block MBa11 may be electrically coupled to the same source line SL. For the ease or convenience of explanation, the source lines SL of the first sub-memory block MBa11 may be grouped into a first source line group SLa11.

The second sub-memory block MBb11 may also be configured in a similar manner to the first sub-memory block MBa11. More specifically, the second sub-memory block MBb11 may be configured to be adjacent to the first sub-memory block MBa11 in the longitudinal direction Y. The second sub-memory block MBb11 may include a plurality of cell strings arranged in both the transverse direction X and the longitudinal direction Y. The bit lines BL11 to BL1k may be electrically coupled to the cell strings arranged in the transverse direction X. The bit lines BL11 and BL1k may also be electrically coupled in common to the drain selection line DSL, the word lines WL1 to WLn, the source selection line SSL and the source line SL. The cell strings arranged in the longitudinal direction Y may be electrically coupled in common to one of the bit lines BL11 to BL1k, at least one of the drain selection lines DSL, the word lines WL1 to WLn, at least one of the source selection lines SSL and the source lines SL.

In addition, memory cells included in the same page may be electrically coupled to the same word line. For instance, n-th memory cells Fn, included in an n-th page of the second sub-memory block MBb11, may be electrically coupled in common to the n-th word line WLn. The n-th memory cells Fn, included in the n-th page, may include the n-th memory cells Fn that are arranged in the transverse direction X and the longitudinal direction Y in the n-th page of the second sub-memory block MBb11. Word lines WL1 to WLn of the second sub-memory block MBb11 may be grouped in to a second word line group WL_GRb. The source selection transistors SST included in the second sub-memory block MBb11, may be electrically coupled to the same source selection line SSL. For the ease and convenience of explanation, the source lines SL of the second sub-memory block MBb11 may be grouped into a second source line group SLb11.

The first and second sub-memory blocks MBa11 and MBb11 may be configured to share the bit lines BL11 to BL1k and not share the source lines SL. More specifically, the first source line group SLa11 of the first sub-memory block MBa11 may be separated from the second source line group SLb11 of the second sub-memory block MBb11. As a result, different voltages may be applied to the first source line group SLa11 and the second source line group SLb11 of the selected memory block MB11 at the same time.

In addition, the first word line group WL_GRa of the first sub-memory block MBa11 may be configured to be separated from the second word line group WL_GRb of the first word line group WL_GRa. Therefore, different voltages may be applied to the first word line group WL_GRa and the second word line group WL_GRb of the selected memory block simultaneously.

As described above, the sub-memory blocks may share bit lines and may not share word lines with a source line group.

Figure 5:
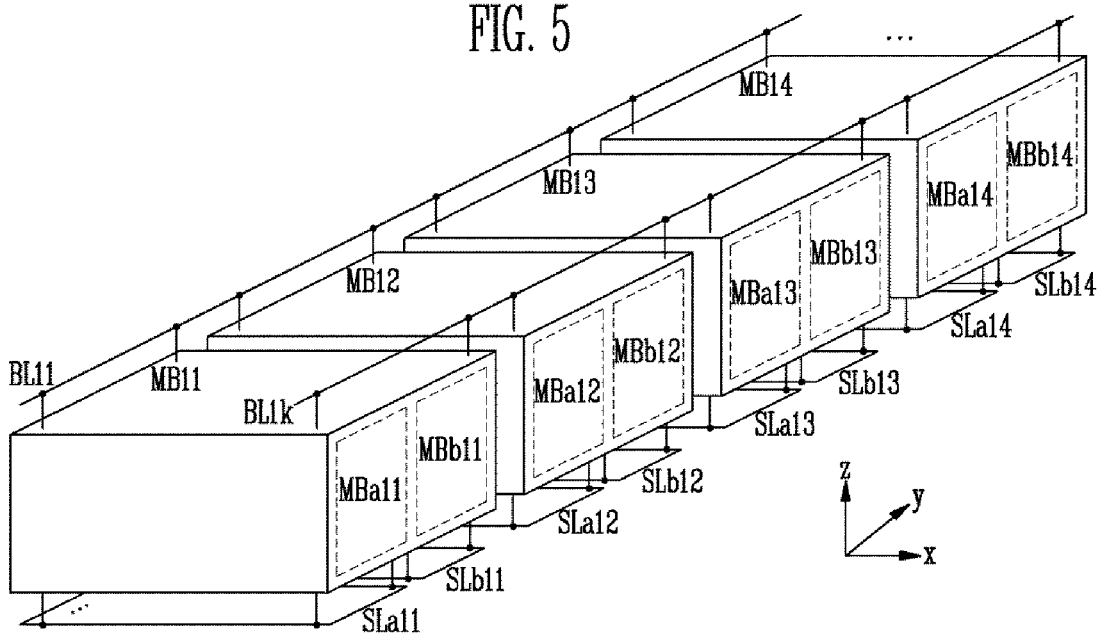
FIG. 5 is a three-dimensional view illustrating memory blocks arranged in a longitudinal direction according to an embodiment of the invention.

Referring to FIG. 5, a three-dimensional view illustrating memory blocks arranged in a longitudinal direction according to an embodiment of the invention is shown.

Memory cells arranged in the longitudinal direction Y may be configured in substantially the same direction as each other. For instance, memory blocks MB11 to MB14 arranged in the longitudinal direction may include first sub-memory blocks MBa11, MBa12, MBa13 and MBa14 and second sub-memory blocks MBb11, MBb12, MBb3 and MBb14 located in the same plane. When the memory block MB11 and the memory block MB12 are adjacent, the second sub-memory block MBb11 of the memory block MB11 and the first sub-memory block MBa12 of the memory block MB12 may be adjacent. Therefore, when the memory block MB13 is adjacent to the memory block MB12, the second sub-memory block MBb12 of the memory block MB12 and the first sub-memory block MBa13 of the memory block MB13 may similarly be adjacent. In this manner, the first sub-memory blocks MBa13 and MBa14 and the second sub-memory blocks MBb13 and MBb14, included in the memory block MB13 and MB14, may be arranged.

Accordingly, during an erase operation, different voltages may be applied to first and second word line groups coupled to the first and second sub-memory blocks MBa11 to MBa14 and MBb11 to MBb14, respectively. In addition, different voltages may also be applied to the first and second source line groups.

Figure 6:
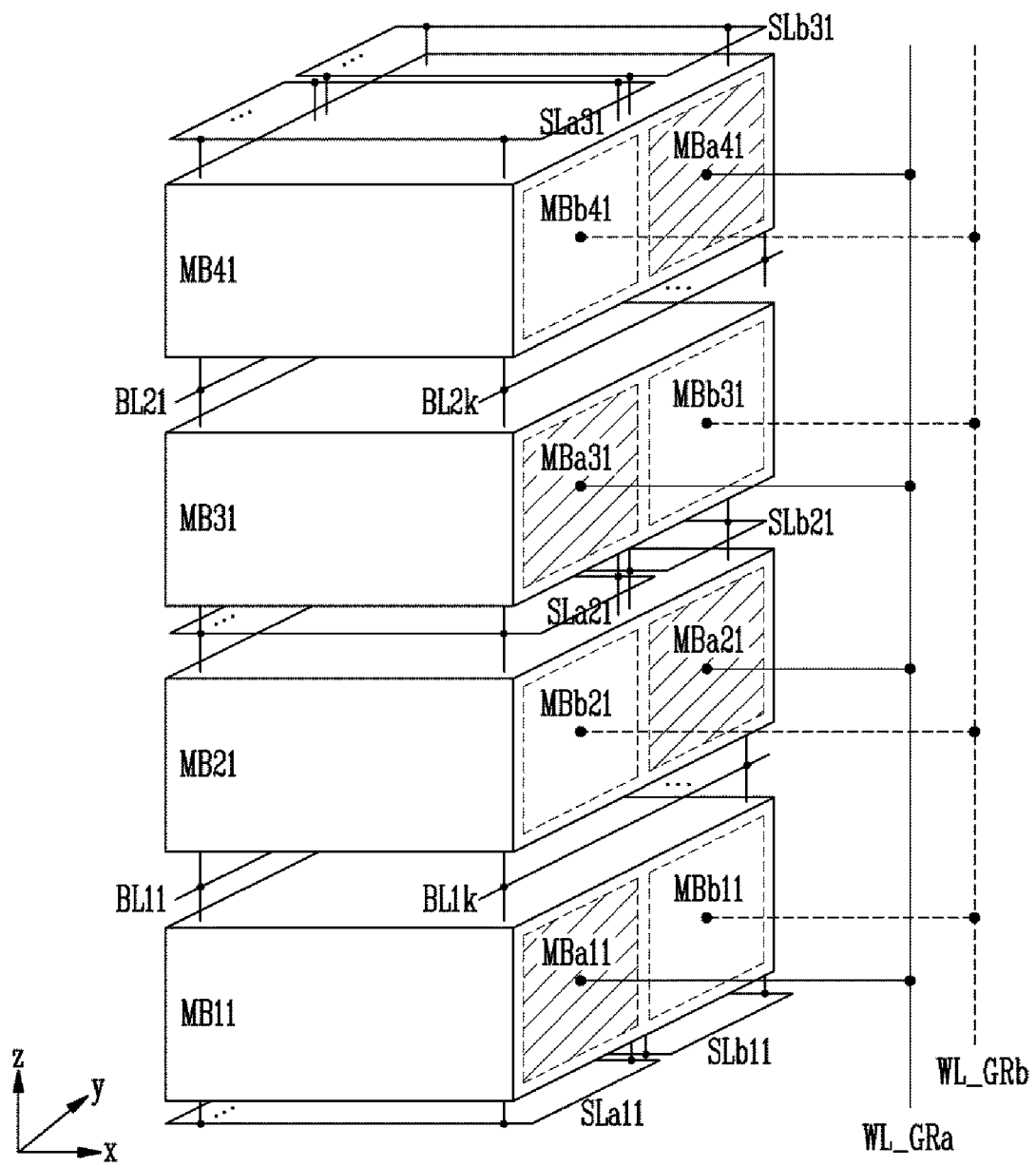
FIG. 6 is a three-dimensional view illustrating the configuration of memory blocks stacked in a vertical direction and an erase operation according to an embodiment of the invention.

Referring to FIG. 6, a three-dimensional view illustrating the configuration of memory blocks stacked in a vertical direction and an erase operation according to an embodiment of the invention is shown.

The memory blocks stacked in the vertical direction Z may include the first and second sub-memory blocks MBa11 to MBa41 and MBb11 to MBb41 as described above with reference to FIG. 5. However, the memory blocks stacked in the vertical direction Z may be arranged so that the first second sub-memory blocks MBa11 to MBa41 and the second sub-memory blocks MBb11 to MBb41 may be arranged in alternating positions. For instance, when the memory block MB21 is stacked over the memory block MB11, the first sub-memory block MBa21 of the memory block MB21 may be configured over the second sub-memory block MBb11 of the memory block MB11. In addition, a second sub-memory block MBb21 of the memory block MB21 may be arranged over the first sub-memory block MBa11 of the memory block MB11. When the memory block MB31 is stacked over the memory block MB21, a first sub-memory block MBa31 of the memory block MB31 may be configured over the second sub-memory block MBb21 of the memory block MB21. A second sub-memory block MBb31 of the memory block MB31 may be configured over the first sub-memory block MBa21 of the memory block MB21. When the memory block MB41 is stacked over the memory block MB31, a first sub-memory block MBa41 of the memory block MB41 may be configured over the second sub-memory block MBb31 of the memory block MB31. A second sub-memory block MBb41 of the memory block MB41 may be configured over the first sub-memory block MBa31 of the memory block MB31.

In addition, memory blocks vertically stacked may share bit lines or source line groups. For instance, when the memory block MB21 is stacked over the memory block MB11, the bit lines BL11 to BL1k may be configured between the memory block MB11 and the memory block MB21. In addition, the memory block MB11 and the memory block MB21 may share the bit lines BL11 to BL1k. The source line groups SLa11 and SLb11 may be electrically coupled to a lower portion of the memory block MB11. Further, source line groups SLa21 and SLb21 may be electrically coupled to an upper portion of the memory block MB21. In substantially the same manner, the memory block MB21 may be configured to share the source line groups SLa21 and SLb21 with the memory block MB31. In addition, the memory block MB31 may share bit lines BL21 to BL2k with the memory block MB41. Source line groups SLa31 and SLb31 may be configured over the memory block MB41.

More specifically, word lines electrically coupled to the first sub-memory blocks MBa11, MBa21, MBa31 and MBa41, among the memory blocks MB11 to MB41 stacked in the vertical direction Z may be electrically coupled in common to the first word line group WL_GRa. Word lines electrically coupled to the second sub-memory blocks MBb11, MBb21, MBb31 and MBb41 may be electrically coupled in common to the second word line group WL_GRb. The first word line group WL_GRa may be configured to be separated from the second word line group WL_GRb. For instance, n-th word lines electrically coupled to an n-th page of the first sub-memory blocks MBa11 to MBa41 may be electrically coupled in common to each other. Therefore, when a first voltage is applied to the n-th word line of the first word line group WL_GRa, the first voltage may be applied in common to the n-th word lines electrically coupled to the first sub-memory blocks MBa11, MBa21, MBa31 and MBa41 of the memory blocks MB11 to MB41 that are stacked in the vertical direction Z. Since the second word line group WL_GRb is separated from the first word line group WL_GRa, when the first voltage is applied to the n-th word line of the first word line group WL_GRa, a second voltage different from the first voltage may be applied to the n-th word line of the second word line group WL_GRb.

An erase operation of the semiconductor system including the memory blocks configured as described above according to an embodiment is hereby described below.

TABLE 1

| | | MB11~MB41 | | | | | | MB12~MB44 | |
|---|---|---|---|---|---|---|---|---|---|
| MB41 | MBb41 (Un) | SLa31 | Veras2 | MBa41 (Un) | SLb31 | Veras2 | MB42~MB44 | SL | Veras2 |
| | | SSL | Vsl2 | | SSL | Vsl2 | | SSL | Vsl2 |
| | | WL_GRb | $V_{WL2}$ or $V_{WL3}$ | | WL_GRa | $V_{WL1}$ | | WL | $V_{WL2}$ |
| | | DSL | Vsl2 | | DSL | Vsl2 | | DSL | Vsl2 |
| | | BL | Vera2 | | BL | Veras2 | | BL | Veras2 |
| MB31 | MBa31 (Sel) | DSL | Vsl2 | MBb31 (Un) | DSL | Vsl2 | MB32~MB34 | DSL | Vsl2 |
| | | WL_GRa | $V_{WL1}$ | | WL_GRb | $V_{WL2}$ or $V_{WL3}$ | | WL | $V_{WL2}$ |
| | | SSL | Vsl1 | | SSL | Vsl2 | | SSL | Vsl2 |
| | | SLa21 | Vera1 | | SLb21 | Veras2 | | SL | Veras2 |
| MB21 | MBb21 (Un) | SSL | Vsl1 | MBa21 (Un) | SSL | Vsl2 | MB22~MB24 | SSL | Vsl2 |
| | | WL_GRb | $V_{WL2}$ or $V_{WL3}$ | | WL_GRa | $V_{WL1}$ | | WL | $V_{WL2}$ |
| | | DSL | Vsl2 | | DSL | Vsl2 | | DSL | Vsl2 |
| | | BL | Vera2 | | BL | Veras2 | | BL | Veras2 |
| MB11 | MBa11 (Un) | DSL | Vsl2 | MBb11 (Un) | DSL | Vsl2 | MB12~MB14 | DSL | Vsl2 |
| | | WL_GRa | $V_{WL1}$ | | WL_GRb | $V_{WL2}$ or $V_{WL3}$ | | WL | $V_{WL2}$ |
| | | SSL | Vsl2 | | SSL | Vsl2 | | SSL | Vsl2 |
| | | SLa11 | Vera2 | | SLb11 | Veras2 | | SL | Veras2 |

When first and second sub-memory blocks of the memory blocks, stacked in the vertical direction Z, are configured in a zigzag pattern, an erase operation of the first sub-memory block MBa31 of the memory block MB31 is exemplified with reference to [Table 1]. When the erase operation of the first sub-memory block MBa31 is performed, voltages applied to the sub-memory blocks MBa11, MBb11, MBa21, MBb21, MBa31, MBb31, MBa41 and MBb41 are described below in detail.

Selected (Sel) First Sub-Memory Block MBa31 of Selected Memory Block MB31

A first erase voltage Vera1 may be applied to the source line group SLa21. A first turn-on voltage Vsl1 may be applied to the source selection lines SSL. A first word line voltage $V_{WL1}$ may be applied to the first word line group WL_GRa. A second turn-on voltage Vsl2 may be applied to the drain selection lines DSL. In addition, a second erase voltage Vera2 may be applied to the bit lines BL. The bit lines BL may include the bit lines BL11 to BL1k and also the bit lines BL21 to BL2k.

The first erase voltage Vera1 may be 18V. The second erase voltage Vera2 may be half of the first erase voltage Vera1, i.e., or 9V. The first turn-on voltage Vsl1 may be 15V. The second turn-on voltage Vsl2 may be less than the first turn-on voltage Vsl1. For instance, the second turn-on voltage Vsl2 may be approximately 2V lower than the second erase voltage Vera2, i.e., 7V. The first word line voltage $V_{WL}1$ may be approximately 0V. Here, 0V may refer to a ground voltage or the like.

When the first erase voltage Vera1 is applied to the source line group SLa21, the first turn-on voltage Vsl1 is applied to the source selection lines SSL. In addition, the first word line voltage $V_{WL1}$ is applied to the first word line group WL_GRa, and an erase voltage may be applied to a channel of the first sub-memory block MBa31. The second turn-on voltage Vsl2 lower than the second erase voltage Vera2 may be applied to the drain selection lines DSL. Further, the second erase voltage Vera2 may be applied to the bit lines BL so that the drain selection transistors DST, shown in FIG. 4, may be turned off. If a potential of the channel increases, the source selection lines SSL may be floated. When the potential of the channel increases to the first erase voltage Vera1, memory cells of the first sub-memory block MBa31 may then be erased by a voltage difference of approximately 18V between the memory cells and the channel.

Unselected (Un) Second Sub-Memory Block MBb31 of Selected Memory Block MB31

The second erase voltage Vera2 may be applied to the source line group SLb21 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

The second erase voltage Vera2 may be half of the first erase voltage Vera1, i.e., 9V. The first turn-on voltage Vsl1 may be approximately 15V. The second turn-on voltage Vsl2 may be approximately 2V lower than the second erase voltage Vera2, i.e., 7V. The second word line voltage $V_{WL2}$ may be 9V and the same as the second erase voltage Vera2. The third word line voltage $V_{WL3}$ may be 18V which is and accordingly the same as the first erase voltage Vera1.

When the second erase voltage Vera2 is applied to the source line group SLb21 and the bit lines BL, the second turn-on voltage Vsl2 is applied to the source selection lines SSL and the drain selection lines DSL. In addition, the second or third word line voltage $V_{WL2}$ or $V_{WL3}$ is applied to the second word line group WL_GRb. Further, the second erase voltage Vera2 may be applied to a channel of the second sub-memory block MBb31. Since the second or third word line voltage $V_{WL2}$ or $V_{WL3}$ is applied to the channel of the second word line group WL_GRb, no voltage difference may occur between the memory cells and the channel as a result. Therefore, memory cells of the second sub-memory block MBb31 may not be erased accordingly.

For instance, when the second word line voltage $V_{WL2}$ of 9V is applied to the second word line group WL_GRb, the memory cells may not be erased since no voltage difference occurs between the memory cells and the channel. No voltage difference may occur even when a potential of the channel is increased to approximately 9V by the second erase voltage Vera2 applied from the source line group SLa21 and the bit lines BL. When the third word line voltage $V_{WL3}$ of approximately 18V is applied to the second word line group WL_GRb, and the potential of the channel is increased to approximately 9V by the second erase voltage Vera2, a voltage difference of approximately 9V may occur between the memory cells and the channel. However, the voltage difference of approximately 9V may then not cause the memory cells to be erased.

Since the second erase voltage Vera2 lower than the first erase voltage Vera1 is applied to the bit lines B and the source line group SLb21 of the unselected second sub-memory block MBb31, power consumption may then be reduced accordingly.

Unselected (Un) First Sub-Memory Block MBa11 Unselected Memory Block MB11

The second erase voltage Vera2 may be applied to the source line group SLa11 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be approximately half of the first erase voltage Vera1, i.e., 9V. The second turn-on voltage Vsl2 may be approximately 2V lower than the second erase voltage Vera2, i.e., or 7V. The first word line voltage $V_{WL}1$ may be approximately 0V. The first word line voltage $V_{WL1}$ may be approximately 0V. Here, 0V may refer to a ground voltage or the like.

When the second erase voltage Vera2 is applied to the source line group SLa21 and the bit lines BL, the second turn-on voltage Vsl2 is then applied to the source selection lines SSL and the drain selection lines DSL. In addition, the first word line voltage $V_{WL1}$ is applied to the first word line group WL_GRa. Further, the second erase voltage Vera2 may be applied to a channel of the first sub-memory block MBa11. Since the first word line voltage $V_{WL1}$ is applied to the first word line group WL_GRa, a voltage difference of approximately 9V may occur between the memory cells and the channel as a result. However, the voltage difference of approximately 9V may then not cause the memory cells to be erased.

Since the second erase voltage Vera2 lower than the first erase voltage Vera1 is applied to the bit lines BL and the source line group SLa11 of the unselected first sub-memory block MBa11, power consumption may be reduced during the erase operation as a result.

Since the second erase voltage Vera2 lower than the first erase voltage Vera1 is applied to the bit lines BL and the source line group SLa11 of the unselected first sub-memory block MBa11, power consumption may be reduced during the erase operation accordingly.

Unselected (Un) Second Sub-Memory Block MBb11 of Unselected Memory Block MB11

The second erase voltage Vera2 may be applied to the source line group SLa11 and the bit lines BL. The second turn-on voltage Vsl2 may be applied to the source selection lines SSL and the drain selection lines DSL. Further, the second or third word line voltage $V_{WL2}$ or $V_{WL3}$ may be applied to the second word line group WL_GRb.

More specifically, the second erase voltage Vera2 may be approximately half of the first erase voltage Vera1, i.e., 9V. The second turn-on voltage Vsl2 may be approximately 2V lower than the second erase voltage Vera2, i.e., or 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel. However, the voltage difference of approximately 9V may then not cause the memory cells to be erased. When the third word line voltage $V_{WL3}$ of 18V is applied to the second word line group WL_GRb, since no voltage difference occurs between the memory cells and the channel, the memory cells may not be erased. Moreover, the memory cells may not be erased even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation as a result.

Unselected (Un) Second Sub-Memory Block MBb21 of Unselected Memory Block MB21

The unselected second sub-memory block MBb21 and the selected first sub-memory block MBa31 may be configured to share the source line group SLa21. Therefore, the first turn-on voltage Vsl1 may also be applied to the source selection lines SSL of the unselected second sub-memory block MBb21. As a result, since the first erase voltage Vera1 may be applied to the channel of the second sub-memory block MBb21, the memory cells may not be erased by applying the second or third word line voltage $V_{WL2}$ or $V_{WL3}$ to the second word line group WL_GRb. The second turn-on voltage Vsl2 may be applied to the drain selection lines DSL. In addition, the second erase voltage Vera2 may be applied to the bit lines BL.

More specifically, the first turn-on voltage Vsl1 may be approximately 15V. The first erase voltage Vera1 may be approximately 18V. The second word line voltage $V_{WL2}$ may be 9V or the same as the second erase voltage Vera2. The third word line voltage $V_{WL3}$ may be 18V or the same as the first erase voltage Vera1. The second turn-on voltage Vsl2 may be approximately 2V lower than the second erase voltage Vera2, i.e., 7V.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may then not cause the memory cells to be erased. When the third word line voltage $V_{WL3}$ of 18V is applied to the second word line group WL_GRb, since no voltage difference occurs between the memory cells and the channel, the memory cells may not be erased. Moreover, the memory cells may not be erased even when the potential of the channel increases to approximately 18V.

Since the second erase voltage Vera2 lower than the first erase voltage Vera1 is applied to the unselected second sub-memory block MBb21 and the bit lines BL, power consumption may be reduced during the erase operation accordingly.

Unselected (Un) First Sub-Memory Block MBa21 of Unselected Memory Block MB21

The second erase voltage Vera2 may be applied to the source line group SLb21 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be approximately half of the first erase voltage Vera1, i.e., 9V. The second turn-on voltage Vsl2 may be approximately 2V lower than the second erase voltage Vera2, or i.e. 7V. The first word line voltage $V_{WL}1$ may be approximately 0V. Here, 0V may refer to a ground voltage or the like.

When the second erase voltage Vera2 is applied to the source line group SLb21 and the bit lines BL, the second turn-on voltage Vsl2 is applied to the source selection lines SSL and the drain selection lines DSL. In addition, the first word line voltage $V_{WL1}$ is applied to the first word line group WL_GRa, the second erase voltage Vera2 may be applied to a channel of the second sub-memory block MBb31. Since the first word line voltage $V_{WL1}$ is applied to the first word line group WL_GRa, a voltage difference of approximately 9V may occur between the memory cells and the channel as a result. However, the voltage difference of approximately 9V may then not cause the memory cells to be erased.

Since the second erase voltage Vera2 lower than the first erase voltage Vera1 is applied to the bit lines B and the source line group SLb21 of the unselected first sub-memory block MBa21, power consumption may be reduced accordingly.

Unselected (Un) Second Sub-Memory Block MBb41 of Unselected Memory Block MB41

The second erase voltage Vera2 may be applied to the source line group SLa31 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be approximately half of the first erase voltage Vera1, i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may then not cause the memory cells to be erased. When the third word line voltage $V_{WL3}$ of 18V is applied to the second word line group WL_GRb, since no voltage difference occurs between the memory cells and the channel, the memory cells may not be erased. The memory cells may not be erased even when the potential of the channel increases to approximately 18V.

Since the second erase voltage Vera2 lower than the first erase voltage Vera1 is applied to the bit lines BL and the source line group SLa31 of the unselected second sub-memory block MBb41, power consumption may be reduced during the erase operation as a result.

Unselected (Un) First Sub-Memory Block MBa41 of Unselected Memory Block MB41

The second erase voltage Vera2 may be applied to the source line group SLb31 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be approximately half of the first erase voltage Vera1, i.e., 9V. The second turn-on voltage Vsl2 may be approximately 2V lower than the second erase voltage Vera2, or i.e. 7V. The first word line voltage $V_{WL}1$ may be approximately 0V. The first word line voltage $V_{WL1}$ may be approximately 0V. Here, 0V may refer to a ground voltage.

When the second erase voltage Vera2 is applied to the source line group SLb31 and the bit lines BL, the second turn-on voltage Vsl2 is applied to the source selection lines SSL and the drain selection lines DSL. In addition, the first word line voltage $V_{WL1}$ is applied to the first word line group WL_GRa. Further, the second erase voltage Vera2 may be applied to a channel of the first sub-memory block MBa41.

Since the first word line voltage $V_{WL1}$ is applied to the second word line group WL_GRb, a voltage difference of approximately 9V may occur between the memory cells and the channel. However, the voltage difference of approximately 9V may then not cause the memory cells to be erased.

Since the second erase voltage Vera2 lower than the first erase voltage Vera1 is applied to the bit lines BL and the source line group SLb31 of the unselected first sub-memory block MBa41, power consumption may be reduced during the erase operation as a result.

Unselected Memory Blocks MB12 to MN44

The second erase voltage Vera2 may be applied to the source lines SL and the bit lines BL electrically coupled to the first and second sub-memory blocks of the unselected memory blocks MB12 to MN44. The second turn-on voltage $V_{WL2}$ may then be applied to the source selection lines SSL and the drain selection lines DSL. The second word line voltage $V_{WL2}$ may be applied to the word lines WL. Since the second word line voltage has the same level as the second erase voltage Vera2, no voltage difference may occur between memory cells and the channel of the unselected memory blocks MB12 to MN44 as a result. Accordingly, the memory cells may not be erased.

When an erase operation is performed on the first sub-memory block MBa31 of the selected memory block MB31, the first word line voltage $V_{WL1}$ may be applied in common to the first word line group WL_GRa electrically coupled to the first sub-memory blocks MBa11, MBa21, MBa31 and MBa41 of the memory blocks stacked in the vertical direction Z, including the selected memory block MB31. In addition, the second or third word line voltage $V_{WL2}$ or $V_{WL3}$ may be applied in common to the second word line group WL_GRb electrically coupled to the second sub-memory blocks MBb11, MBb21, MBb31 and MBb41.

Since different erase voltages may be applied to the source line group SLa21 of the first sub-memory block MBa31 and the source line group SLb21 of the second sub-memory block MBb31, a surge in power consumption may be prevented as a result.

Figure 7:
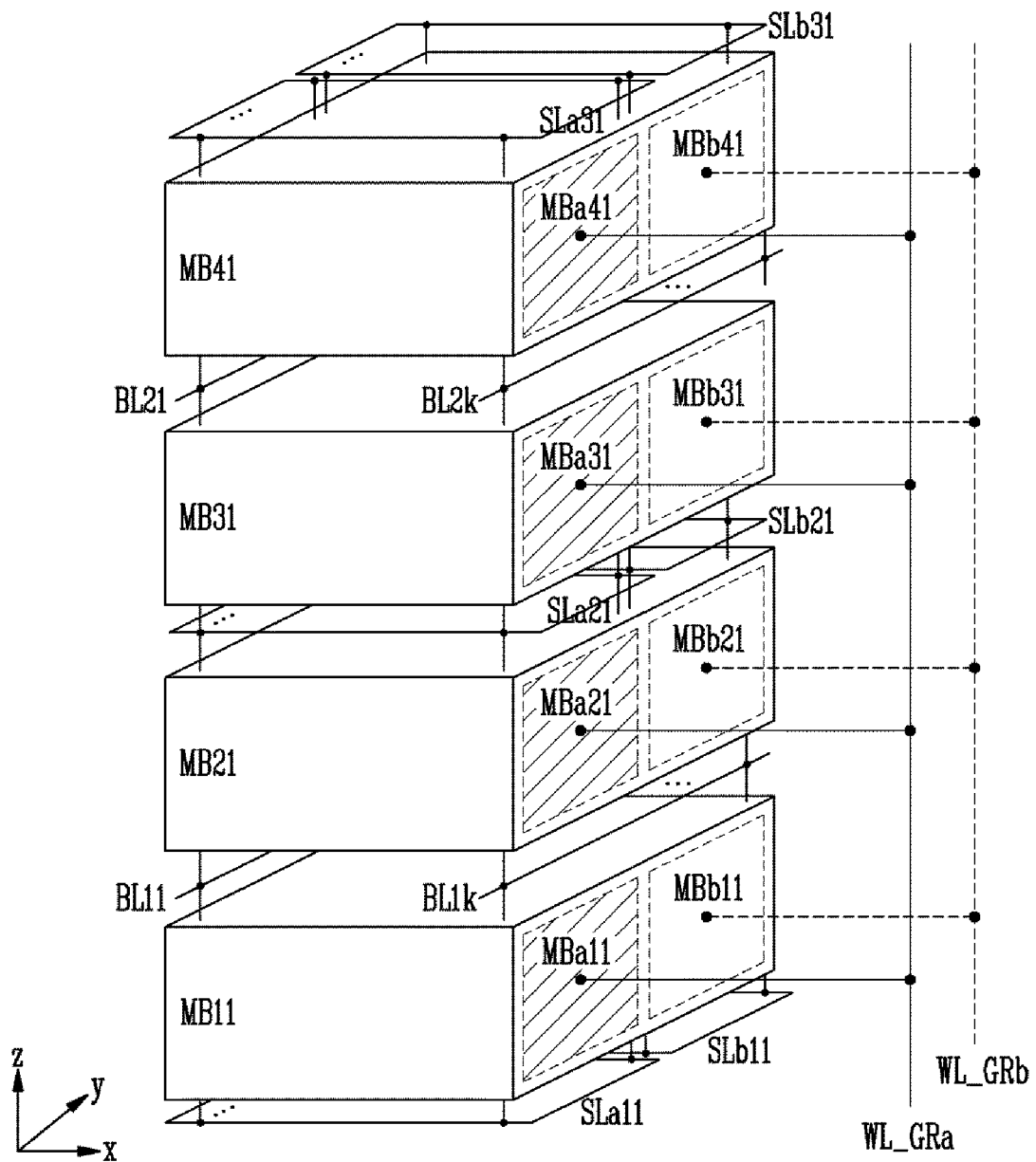
FIG. 7 is a three-dimensional view illustrating the configuration of memory blocks stacked in a vertical direction and an erase operation according to an embodiment of the invention.

Referring to FIG. 7, a three-dimensional view illustrating the configuration and an erase operation of memory blocks stacked in a vertical direction according to an embodiment of the invention is illustrated.

The memory blocks MB11, MB21, MB31 and MB41, stacked in the vertical direction Z, may include the first and second sub-memory blocks MBa11 to MBa41 and MBb11 to MBb41 as illustrated in FIG. 5. However, the first and second sub-memory blocks MBa11 to MBa41 and MBb11 to MBb41 of the memory blocks MB11, MB21, MB31 and MB41 may be stacked in the same vertical columns. For instance, when the memory block MB21 is stacked over the memory block MB11, the first sub-memory block MBa21 of the memory block MB21 may be configured over the first sub-memory block MBa11 of the memory block MB11. In addition, the second sub-memory block MBb21 of the memory block MB21 may be configured over the second sub-memory block MBb11 of the memory block MB11. When the memory block MB31 is stacked over the memory block MB21, the first sub-memory block MBa31 of the memory block MB31 may be configured over the first sub-memory block MBa21 of the memory block MB21. Further, the second sub-memory block MBb31 of the memory block MB31 may be arranged over the second sub-memory block MBb21 of the memory block MB21. When the memory block MB41 is stacked over the memory block MB31, the first sub-memory block MBa41 of the memory block MB41 may be configured over the first sub-memory block MBa31 of the memory block MB31. In addition, the second sub-memory block MBb41 of the memory block MB41 may be arranged over the second sub-memory block MBb31 of the memory block MB31.

In addition, memory blocks stacked in a vertical direction may be configured to share bit lines or source line groups. For instance, when the memory block MB21 is stacked over the memory block MB11, the bit lines BL11 to BL1k may be configured between the memory block MB11 and the memory block MB21. In addition, the memory block MB11 and the memory block MB21 may share the bit lines BL11 to BL1k. In this instance, the source line groups SLa11 and SLb11 may be electrically coupled to a lower portion of the memory block MB11. In addition, the source line groups SLa21 and SLb21 may be electrically coupled to an upper portion of the memory block MB21. In the same manner, the memory block MB21 may share the source line groups SLa21 and SLb21 with the memory block MB31. Further, the memory block MB31 may share the bit lines BL21 to BL2k with the memory block MB41. The source line groups SLa31 and SLb31 may be configured over the memory block MB41.

More specifically, word lines electrically coupled to the first sub-memory blocks MBa11, MBa21, MBa31 and MBa41, among the memory blocks MB11 to MB41 stacked in the vertical direction Z, may be electrically coupled in common to the first word line group WL_GRa. Word lines electrically coupled to the second sub-memory blocks MBb11, MBb21, MBb31 and MBb41 may be electrically coupled in common to the second word line group WL_GRb. The first word line group WL_GRa may be separated from the second word line group WL_GRb. For instance, n-th word lines electrically coupled to an n-th page of the first sub-memory blocks MBa11 to MBa41 may be electrically coupled in common. Therefore, when a first voltage is applied to the n-th word line of the first word line group WL_GRa, the first voltage may be then applied in common to the n-th word lines. The n-th word lines are electrically coupled to the first sub-memory blocks MBa11, MBa21, MBa31 and MBa41 of the memory blocks MB11 to MB41 stacked in the vertical direction Z. Since the second word line group WL_GRb is separated from the first word line group WL_GRa, when the first voltage is applied to the n-th word line of the first word line group WL_GRa, a second voltage different from the first voltage may be applied to the n-th word line of the second word line group WL_GRb.

An erase operation of the semiconductor system including the memory blocks configured as described above according to an embodiment is described below.

When first and second sub-memory blocks of memory blocks stacked in the vertical direction Z are arranged in the same vertical columns, an erase operation of the first sub-memory block MBa31 of the memory block MB31 is exemplified with reference to [Table 2]. When the erase operation of the first sub-memory block MBa31 is performed, voltages applied to the sub-memory blocks MBa11, MBb11, MBa21, MBb21, MBa31, MBb31, MBa41 and MBb41 are described below.

Selected (Sel) First Sub-Memory Block MBa31 of Selected Memory Block MB31

The first erase voltage Vera1 may be applied to the source line group SLa21. The first turn-on voltage Vsl1 is applied to the source selection lines SSL. The first word line voltage $V_{WL1}$ may be applied to the first word line group WL_GRa. The second turn-on voltage Vsl2 may be applied to the drain selection lines DSL. In addition, the second erase voltage Vera2 may be applied to the bit lines BL. The bit lines BL may include the bit lines BL11 to BL1k and the bit lines BL21 to BL2k.

More specifically, the first erase voltage Vera1 may be approximately 18V. The second erase voltage Vera2 may be approximately half of the first erase voltage Vera1, i.e., 9V. The first turn-on voltage Vsl1 may be approximately 15V. The second turn-on voltage Vsl2 may be lower than the first turn-on voltage Vsl1. For instance, the second turn-on voltage Vsl2 may be approximately 2V lower than the second erase voltage Vera2, or i.e., 7V. The first word line voltage $V_{WL}1$ may be 0V. Here, 0V may refer to a ground voltage or the like.

When the first erase voltage Vera1 is applied to the source line group SLa21, the first turn-on voltage Vsl1 is applied to the source selection lines SSL. In addition, the first word line voltage $V_{WL1}$ is applied to the first word line group WL_GRa. Further, an erase voltage may be applied to a channel of the first sub-memory block MBa31. The second turn-on voltage Vsl2 lower than the second erase voltage Vera2 may be applied to the drain selection lines DSL. The second erase voltage Vera2 may be applied to the bit lines BL so that the drain selection transistors DST, shown in FIG. 4, may be turned off. When a potential of the channel increases, the source selection lines SSL may be floated. When the potential of the channel increases to the first erase voltage Vera1, the memory cells of the first sub-memory block MBa31 may be erased by a voltage difference of approximately 18V between the memory cells and the channel.

Unselected (Un) Second Sub-Memory Block MBb31 of Selected Memory Block MB31

TABLE 2

| | | MB11~MB41 | | | | |
|---|---|---|---|---|---|---|
| MB41 | MBa41 (Un) | SLa31 | Vera2 | MBb41 (Un) | SLb31 | Vera2 |
| | | SSL | Vsl2 | | SSL | Vsl2 |
| | | WL_GRa | $V_{WL1}$ | | WL_GRb | $V_{WL2}$ or $V_{WL3}$ |
| | | DSL | Vsl2 | | DSL | Vsl2 |
| | | BL | Vera2 | | BL | Vera2 |
| MB31 | MBa31 (Sel) | DSL | Vsl2 | MBb31 (Un) | DSL | Vsl2 |
| | | WL_GRa | $V_{WL1}$ | | WL_GRb | $V_{WL2}$ or $V_{WL3}$ |
| | | SSL | Vsl1 | | SSL | Vsl2 |
| | | SLa21 | Vera1 | | SLb21 | Vera2 |
| MB21 | MBa21 (Un) | SSL | Vsl2 | MBb21 (Un) | SSL | Vsl2 |
| | | WL_GRa | $V_{WL1}$ | | WL_GRb | $V_{WL2}$ or $V_{WL3}$ |
| | | DSL | Vsl2 | | DSL | Vsl2 |
| | | BL | Vera2 | | BL | Vera2 |
| MB11 | MBa11 (Un) | DSL | Vsl2 | MBb11 (Un) | DSL | Vsl2 |
| | | WL_GRa | $V_{WL1}$ | | WL_GRb | $V_{WL2}$ or $V_{WL3}$ |
| | | SSL | Vsl2 | | SSL | Vsl2 |
| | | SLa11 | Vera2 | | SLb11 | Vera2 |

The second erase voltage Vera2 may be applied to the source line group SLb21 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be approximately half of the first erase voltage Vera1, i.e., 9V. The first turn-on voltage Vsl1 may be 15V. The second turn-on voltage Vsl2 may be approximately 2V lower than the second erase voltage Vera2. The second word line voltage $V_{WL2}$ may be 9V or the same as the second erase voltage Vera2. The third word line voltage $V_{WL3}$ may be 18V or the same as the first erase voltage Vera1.

When the second erase voltage Vera2 is applied to the source line group SLb21 and the bit lines BL, the second turn-on voltage Vsl2 is applied to the source selection lines SSL and the drain selection lines DSL. Further, the second or third word line voltage $V_{WL2}$ or $V_{WL3}$ is applied to the second word line group WL_GRb. In addition, the second erase voltage Vera2 may be applied to a channel of the second sub-memory block MBb31. Since the second or third word line voltage $V_{WL2}$ or $V_{WL3}$ is applied to the second word line group WL_GRb, there may be a small voltage difference between the memory cells and the channel. Therefore, the memory cells of the second sub-memory block MBb31 may not be erased as a result.

For instance, when the second word line voltage $V_{WL2}$ of 9V is applied to the second word line group WL_GRb, although a potential of the channel of the second erase voltage Vera2, applied from the source line group SLa21 and the bit lines BL, increases to approximately 9V, the memory cells may not be erased. The memory cells may not be erased since no voltage difference occurs between the memory cells and the channel. When the third word line voltage $V_{WL3}$ of 18V is applied, and the potential of the channel increases to approximately 9V by the second erase voltage Vera2 applied from the source line group SLa21 and the bit lines BL, a voltage difference of approximately 9V may occur between the memory cells and the channel as a result. However, the voltage difference of approximately 9V may not cause the memory cells to be erased.

Since the second erase voltage Vera2 lower than the first erase voltage Vera1 is applied to the bit lines B and the source line group SLb21 of the unselected second sub-memory block MBb31, power consumption may be reduced accordingly.

Unselected (Un) First Sub-Memory Block MBa11 of Unselected Memory Block MB11

The second erase voltage Vera2 may be applied to the source line group SLa11 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be approximately half of the first erase voltage Vera1, i.e., 9V. The second turn-on voltage Vsl2 may be approximately 2V lower than the second erase voltage Vera2, or i.e. 7V. The first word line voltage $V_{WL}1$ may be 0V. Here, 0V may refer to a ground voltage or the like.

When the second erase voltage Vera2 is applied to the source line group SLa21 and the bit lines BL, the second turn-on voltage Vsl2 is applied to the source selection lines SSL and the drain selection lines DSL. Further, the first word line voltage $V_{WL1}$ is applied to first word line group WL_GRa, and the second erase voltage Vera2 may be applied to a channel of the first sub-memory block MBa11. Since the first word line voltage $V_{WL1}$ is applied to the first word line group WL_GRa, a voltage difference of approximately 9V may occur between the memory cells and the channel. However, the voltage difference of approximately 9V may then not cause the memory cells to be erased.

Since the second erase voltage Vera2 lower than the first erase voltage Vera1 is applied to the bit lines BL and the source line group SLa11 of the unselected first sub-memory block MBa11, power consumption may be reduced during the erase operation as a result.

Unselected (Un) Second Sub-Memory Block MBb11 of Unselected Memory Block MB11

The second erase voltage Vera2 may be applied to the source line group SLa11 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V which is the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may not cause the memory cells to be erased. When the third word line voltage $V_{WL3}$ of 18V is applied to the second word line group WL_GRb, since no voltage difference occurs between the memory cells and the channel, the memory cells may not be erased. Moreover, the memory cells may not be erased even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation accordingly.

Unselected (Un) First Sub-Memory Block MBa21 of Unselected Memory Block MB21

The first sub-memory block MBa21 of the memory block MB21 may be configured to share the source line group SLa21 with the first sub-memory block MBa31 of the memory block MB31. Since the first erase voltage Vera1 of approximately 18V is applied to the source line group SLa21, the second turn-on voltage Vsl2 may be applied to the source selection lines SSL of the first sub-memory block MBa21 to not erase the memory cells included in the first sub-memory block MBa21 of the memory block MB21. The second turn-on voltage Vsl2 may be half of the first erase voltage Vera1, i.e., or 9V. The second erase voltage Vera2 may be applied to the bit lines BL. The second turn-on voltage Vsl2 may be applied to the source selection lines SSL and the drain selection lines DSL. In addition, the first word line voltage $V_{WL1}$ may be applied to the first word line group WL_GRa. Even when the first word line voltage $V_{WL1}$ is 0V, the potential of the channel of the first sub-memory block MBa21 may increase only to the second turn-on voltage Vsl2 by the voltage applied to the source selection lines SSL. When the potential of the channel increases to approximately 9V corresponding to the second turn-on voltage Vsl2, a voltage difference of approximately 9V may occur between the channel and the memory cells as a result. However, the voltage difference of approximately 9V may nevertheless not cause the memory cells to be erased.

Unselected (Un) Second Sub-Memory Block MBb21 of Unselected Memory Block MB21

The second erase voltage Vera2 may be applied to the source line group SLa11 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may then not cause the memory cells to be erased. When the third word line voltage $V_{WL3}$ of 18V is applied to the second word line group WL_GRb, since no voltage difference occurs between the memory cells and the channel, the memory cells may not be erased. Further, the memory cells may not be erased even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation as a result.

Unselected (Un) First Sub-Memory Block MBa41 of Unselected Memory Block MB41

The second erase voltage Vera2 may be applied to the source line group SLa31 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be half of the first erase voltage Vera1, or i.e., 9V. The second turn-on voltage Vsl2 may be approximately 2V lower than the second erase voltage Vera2, or i.e. 7V. The first word line voltage $V_{WL1}$ may be 18V or the same as the first erase voltage Vera1. The first word line voltage $V_{WL1}$ may be 0V. Here, 0V may refer to a ground voltage or the like.

When the second erase voltage Vera2 is applied to the source line group SLa31 and the bit lines BL, the second turn-on voltage Vsl2 is applied to the source selection lines SSL and the drain selection lines DSL. In addition, the first word line voltage $V_{WL1}$ is applied to the first word line group WL_GRa. Further, the second erase voltage Vera2 may be applied to a channel of the first sub-memory block MBa41. Since the first word line voltage $V_{WL1}$ is applied to the first word line group WL_GRa, a voltage difference of approximately 9V may occur between the memory cells and the channel. However, the voltage difference of approximately 9V may nevertheless not cause the memory cells to be erased.

Since the second erase voltage Vera2 lower than the first erase voltage Vera1 is applied to the bit lines BL and the source line group SLa11 of the unselected first sub-memory block MBa11, power consumption may be reduced during the erase operation accordingly.

Unselected (Un) Second Sub-Memory Block MBb41 of Unselected Memory Block MB41

The second erase voltage Vera2 may be applied to the source line group SLb31 and the bit lines BL. The second turn-on voltage Vsl2 may be applied to the source selection lines SSL and the drain selection lines DSL. Further, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may then not cause the memory cells to be erased. When the third word line voltage $V_{WL3}$ of 18V is applied to the second word line group WL_GRb, since no voltage difference occurs between the memory cells and the channel, the memory cells may not be erased. Moreover, the memory cells may not be erased even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation as a result.

The remaining unselected memory blocks MB12 to MN44 may be operated in substantially the same manner as those in first embodiment described above.

As described above, while the erase operation is performed on the first sub-memory block MBa31 of the selected memory block MB31, the first word line voltage $V_{WL1}$ may be applied in common to the first word line group WL_GRa. The first word line group WL_GRa may be electrically coupled to the first sub-memory blocks MBa11, MBa21, MBa31 and MBa41 of the memory blocks stacked in the vertical direction Z, including the selected memory block MB31. In addition, the second or third word line voltage $V_{WL2}$ or $V_{WL3}$ may be applied in common to the second word line group WL_GRb electrically coupled to the second sub-memory blocks MBb11, MBb21, MBb31 and MBb41.

Since different erase voltages may be applied to the source line group SLa21 of the first sub-memory block MBa31 and the source line group SLb21 of the second sub-memory block MBb31, a surge in power consumption may be prevented as a result.

An erase operation according to an embodiment of a semiconductor system is described below.

TABLE 3

| | | | | | | | |
|---|---|---|---|---|---|---|---|
| | | | | MB11~MB41 | | | |
| MB41 | MBa41 (Un) | SLa31<br>SSL<br>WL_GRa<br>DSL<br>BL | Vera2<br>Vsl2<br>$V_{WL1}$<br>Vsl2<br>Vera2 | MBb41 (Un) | SLb31<br>SSL<br>WL_GRb<br>DSL<br>BL | Vera2<br>Vsl2<br>$V_{WL2}$ or $V_{WL3}$<br>Vsl2<br>Vera2 | |
| MB31 | MBa31 (Sel) | DSL<br>WL_GRa<br>SSL<br>SLa21 | Vsl2<br>$V_{WL1}$<br>Vsl1<br>Vera1 | MBb31 (Un) | DSL<br>WL_GRb<br>SSL<br>SLb21 | Vsl2<br>$V_{WL2}$ or $V_{WL3}$<br>Vsl2<br>Vera2 | |
| MB21 | MBa21 (Sel) | SSL<br>WL_GRa<br>DSL<br>BL | Vsl1<br>$V_{WL1}$<br>Vsl2<br>Vera2 | MBb21 (Un) | SSL<br>WL_GRb<br>DSL<br>BL | Vsl2<br>$V_{WL2}$ or $V_{WL3}$<br>Vsl2<br>Vera2 | |
| MB11 | MBa11 (Un) | DSL<br>WL_GRa<br>SSL<br>SLa11 | Vsl2<br>$V_{WL1}$<br>Vsl2<br>Vera2 | MBb11 (Un) | DSL<br>WL_GRb<br>SSL<br>SLb11 | Vsl2<br>$V_{WL2}$ or $V_{WL3}$<br>Vsl2<br>Vera2 | |

When first and second sub-memory blocks of memory blocks arranged in the vertical direction Z are configured in the same vertical columns, a method of erasing two sub-memory blocks stacked in the vertical direction Z is exemplified with reference to [Table 3]. For instance, sub-memory blocks that share a source line group or bit lines may be erased at the same time. A method of simultaneously erasing the first sub-memory block MBa31 of the memory block MB31 and the first sub-memory block MBa21 of the memory block MB21, which share the source line group SLa21 with each other, will be exemplified with reference to [Table 3].

Selected (Sel) First Sub-Memory Block MBa31 of Selected Memory Block MB31

The first erase voltage Vera1 may be applied to the source line group SLa21. The first turn-on voltage Vsl1 is applied to the source selection lines SSL. The first word line voltage $V_{WL1}$ may be applied to the first word line group WL_GRa. The second turn-on voltage Vsl2 may be applied to the drain selection lines DSL. In addition, the second erase voltage Vera2 may be applied to the bit lines BL. The bit lines BL may include BL11 to BL1k and BL21 to BL2k.

More specifically, the first erase voltage Vera1 may be approximately 18V. The second erase voltage Vera2 may be half of the first erase voltage Vera1, or i.e., 9V. The first turn-on voltage Vsl1 may be 15V. The second turn-on voltage Vsl2 may be lower than the first turn-on voltage Vsl1. For instance, the second turn-on voltage Vsl2 may be approximately 2V lower than the second erase voltage Vera2. The first word line voltage $V_{WL}$1 may be 0V. The first word line voltage $V_{WL1}$ may be 0V, wherein 0V may refer to a ground voltage.

When the first erase voltage Vera1 is applied to the source line group SLa21, the first turn-on voltage Vsl1 is applied to the source selection lines SSL. In addition, the first word line voltage $V_{WL1}$ is applied to the first word line group WL_GRa. Further, the erase voltage may be applied to a channel of the first sub-memory block MBa31. Since the second turn-on voltage Vsl2 lower than the second erase voltage Vera2 is applied to the drain selection lines DSL, and the second erase voltage Vera2 is applied to the bit lines BL, the drain selection transistors DST, shown in FIG. 4, may be turned off as a result. Under these circumstances, if a potential of the channel increases, the source selection lines SSL may be floated accordingly. When the potential of the channel increases to the first erase voltage Vera1, the memory cells of the first sub-memory block MBa31 may then be erased by a voltage difference of approximately 18V between the memory cells and the channel.

Unselected (Un) Second Sub-Memory Block MBb31 of Selected Memory Block MB31

The second erase voltage Vera2 may be applied to the source line group SLb21 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The first turn-on voltage Vsl1 may be 15V. The second turn-on voltage Vsl2 may be approximately 2V lower than the second erase voltage Vera2, or i.e. 7V. The second word line voltage $V_{WL2}$ may be 9V or the same as the second erase voltage Vera2. The third word line voltage $V_{WL3}$ may be 18V or the same as the first erase voltage Vera1.

When the second erase voltage Vera2 is applied to the source line group SLb21 and the bit lines BL, the second turn-on voltage Vsl2 is applied to the source selection lines SSL and the drain selection lines DSL. Further, the second or third word line voltage $V_{WL2}$ or $V_{WL3}$ is applied to the second word line group WL_GRb. In addition, the second erase voltage Vera2 may be applied to a channel of the second sub-memory block MBb31. Since the second or third word line voltage $V_{WL2}$ or $V_{WL3}$ is applied to the second word line group WL_GRb, there may be a small voltage difference between the memory cells and the channel as a result. Therefore, the memory cells of the second sub-memory block MBb31 may not be erased. For example, when the second word line voltage $V_{WL2}$ of 9V is applied to the second word line group WL_GRb, although a potential of the channel of the second erase voltage Vera2, applied from the source line group SLa21 and the bit lines BL, increases to approximately 9V, the memory cells may not be erased. Moreover, the memory cells may not be erased since no voltage difference occurs between the memory cells and the channel. When the third word line voltage $V_{WL3}$ of 18V, and a potential of the channel increases to approximately 9V by the second erase voltage Vera2 applied from the source line group SLa21 and the bit lines BL, a voltage difference of approximately 9V may occur between the memory cells and the channel. However, the voltage difference of approximately 9V may nevertheless not cause the memory cells to be erased.

Since the second erase voltage Vera2 lower than the first erase voltage Vera1 is applied to the bit lines B and the source line group SLb21 of the unselected second sub-memory block MBb31, power consumption may be reduced accordingly.

Selected (Sel) First Sub-Memory Block MBa21 of Selected Memory Block MB21

The first sub-memory block MBa21 of the memory block MB21 and the first sub-memory block MBa31 of the memory block MB31 may be configured to share the source line group SLa21. Since the first erase voltage Vera1 is applied to the source line group SLa21, the first turn-on voltage Vsl1 may be applied to the source selection lines SSL of the first sub-memory block MBa21 as a result. The second erase voltage Vera2 may be applied to the bit lines BL. The second turn-on voltage Vsl2 may be applied to the drain selection lines DSL. In addition, the first word line voltage $V_{WL1}$ may be applied to the first word line group WL_GRa.

More specifically, the first erase voltage Vera1 may be approximately 18V. The second erase voltage Vera2 may be half of the first erase voltage Vera1, or i.e., 9V. The first turn-on voltage Vsl1 may be approximately 15V. The second turn-on voltage Vsl2 may be lower than the first turn-on voltage Vsl1. For instance, the second turn-on voltage Vsl2 may be approximately 2V lower than the second erase voltage Vera2. The first word line voltage $V_{WL1}$ may be 0V, wherein 0V may refer to a ground voltage.

When the first erase voltage Vera1 is applied to the source line group SLa21, the first turn-on voltage Vsl1 is applied to the source selection lines SSL. In addition, the first word line voltage $V_{WL1}$ is applied to the first word line group WL_GRa. Further, the erase voltage may be applied to a channel of the first sub-memory block MBa31. Since the second turn-on voltage Vsl2 lower than the second erase voltage Vera2 is applied to the drain selection lines DSL, and the second erase voltage Vera2 is applied to the bit lines BL, the drain selection transistors DST, shown in FIG. 4, may be turned off as a result. If a potential of the channel increases, the source selection lines SSL may be floated. When the potential of the channel increases to the first erase voltage Vera1, the memory cells of the first sub-memory block MBa31 may be erased by a voltage difference of approximately 18V between the memory cells and the channel accordingly.

Unselected (Un) Second Sub-Memory Block MBb21 of Selected Memory Block MB21

The second erase voltage Vera2 may be applied to the source line group SLa11 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel accordingly. However, the voltage difference of approximately 9V may nonetheless not cause the memory cells to be erased. When the third word line voltage $V_{WL3}$ of 18V is applied to the second word line group WL_GRb, since no voltage difference occurs between the memory cells and the channel, the memory cells may not be erased as such even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation as a result.

Unselected (Un) First Sub-Memory Block MBa11 of Unselected Memory Block MB11

The second erase voltage Vera2 may be applied to the source line group SLa11 and the bit lines BL. The second turn-on voltage Vsl2 may be applied to the source selection lines SSL and the drain selection lines DSL. Further, the first word line voltage $V_{WL1}$ may be applied to the first word line group WL_GRa.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The first word line voltage $V_{WL}1$ may be 0V, wherein 0V may refer to a ground voltage.

When the second erase voltage Vera2 is applied to the source line group SLa21 and the bit lines BL, the second turn-on voltage Vsl2 is applied to the source selection lines SSL and the drain selection lines DSL. In addition, the first word line voltage $V_{WL1}$ is applied to the first word line group WL_GRa. Further, the second erase voltage Vera2 may be applied to a channel of the first sub-memory block MBa11. Since the first word line voltage $V_{WL1}$ is applied to the first word line group WL_GRa, a voltage difference of approximately 9V may occur between the memory cells and the channel as a result. However, the voltage difference of approximately 9V may nevertheless not cause the memory cells to be erased.

Since the second erase voltage Vera2 which is lower than the first erase voltage Vera1 is applied to the bit lines BL and the source line group SLa11 of the unselected first sub-memory block MBa11, power consumption may be reduced during the erase operation accordingly.

Unselected (Un) Second Sub-Memory Block MBb11 of Unselected Memory Block MB11

The second erase voltage Vera2 may be applied to the source line group SLa11 and the bit lines BL. The second turn-on voltage Vsl2 may be applied to the source selection lines SSL and the drain selection lines DSL. Further, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may nonetheless not cause the memory cells to be erased. When the third word line voltage $V_{WL3}$ of 18V is applied to the second word line group WL_GRb, since no voltage difference occurs between the memory cells and the channel, the memory cells may not be erased as a result even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation accordingly.

Unselected (Un) First Sub-Memory Block MBa41 of Unselected Memory Block MB41

The second erase voltage Vera2 may be applied to the source line group SLa31 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be half of the first erase voltage Vera1, or i.e., 9V. The second turn-on voltage Vsl2 may be approximately 2V lower than the second erase voltage Vera2, or i.e. 7V. The first word line voltage $V_{WL1}$ may be 18V or the same as the first erase voltage Vera1. The first word line voltage $V_{WL}1$ may be 0V in which 0V may refer to a ground voltage.

When the second erase voltage Vera2 may be applied to the source line group SLa31 and the bit lines BL, the second turn-on voltage Vsl2 is applied to the source selection lines SSL and the drain selection lines DSL. In addition, the first word line voltage $V_{WL1}$ is applied to the first word line group WL_GRa. Further, the second erase voltage Vera2 may be applied to a channel of the first sub-memory block MBa41. Since the first word line voltage $V_{WL1}$ is applied to the first word line group WL_GRa, a voltage difference of approximately 9V may occur between the memory cells and the channel. However, the voltage difference of approximately 9V may nevertheless not cause the memory cells to be erased.

Since the second erase voltage Vera2 lower than the first erase voltage Vera1 is applied to the bit lines BL and the source line group SLa11 of the unselected first sub-memory block MBa11, power consumption may be reduced during the erase operation as a result.

Unselected (Un) Second Sub-Memory Block MBb41 of Unselected Memory Block MB41

The second erase voltage Vera2 may be applied to the source line group SLb31 and the bit lines BL. The second turn-on voltage Vsl2 may be applied to the source selection lines SSL and the drain selection lines DSL. Further, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may nonetheless not cause the memory cells to be erased. When the third word line voltage $V_{WL3}$ of 18V is applied to the second word line group WL_GRb, since no voltage difference occurs between the memory cells and the channel, the memory cells as a result may not be erased even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation as a result.

The remaining unselected memory blocks MB12 to MN44 may be operated in a substantially similar manner as those in the first embodiment as described above.

When an erase operation is performed on the first sub-memory block MBa31 of the selected memory block MB31 and the first sub-memory block MBa21 of the selected memory block MB21 simultaneously, the first word line voltage $V_{WL1}$ may be applied in common to the first word line group WL_GRa. The first word line group WL_GRa may be electrically coupled to the first sub-memory blocks MBa11, MBa21, MBa31 and MBa41 of the memory blocks stacked in the vertical direction Z. In addition, the second or third word line voltage $V_{WL2}$ or $V_{WL3}$ may be applied in common to the second word line group WL_GRb. The second word line group WL_GRb may be electrically coupled to the second sub-memory blocks MBb11, MBb21, MBb31 and MBb41.

Since sub-memory blocks that are adjacent in the vertical direction share a source line group or bit lines, the sub-memory blocks that share a source line group or bit lines to which the first erase voltage Vera1 is applied may be erased simultaneously. Therefore, power consumption may be reduced during the erase operation as a result.

An erase operation of a semiconductor system according to an embodiment is described below.

TABLE 4

| | | MB11~MB41 | | | | |
|---|---|---|---|---|---|---|
| MB41 | MBa41 (Un) | SLa31 | Vera2 | MBb41 (Un) | SLb31 | Vera2 |
| | | SSL | Vsl2 | | SSL | Vsl2 |
| | | WL_GRa | $V_{WL1}$ | | WL_GRb | $V_{WL2}$ or $V_{WL3}$ |
| | | DSL | Vsl2 | | DSL | Vsl2 |
| | | BL | Vera2 | | BL | Vera2 |
| MB31 | MBa31 (Sel) | DSL | Vsl2 | MBb31 (Un) | DSL | Vsl2 |
| | | WL_GRa | $V_{WL1}$ | | WL_GRb | $V_{WL2}$ or $V_{WL3}$ |
| | | SSL | Vsl1 | | SSL | Vsl2 |
| | | SLa21 | Vera1 | | SLb21 | Vera2 |
| MB21 | MBa21 (Un) | SSL | Vsl2 | MBb21 (Un) | SSL | Vsl2 |
| | | WL_GRa | $V_{WL1}$ | | WL_GRb | $V_{WL2}$ or $V_{WL3}$ |
| | | DSL | Vsl2 | | DSL | Vsl2 |
| | | BL | Vera2 | | BL | Vera2 |
| MB11 | MBa11 (Sel) | DSL | Vsl2 | MBb11 (Un) | DSL | Vsl2 |
| | | WL_GRa | $V_{WL1}$ | | WL_GRb | $V_{WL2}$ or $V_{WL3}$ |
| | | SSL | Vsl1 | | SSL | Vsl2 |
| | | SLa11 | Vera1 | | SLb11 | Vera2 |

When first and second sub-memory blocks of memory blocks arranged in the vertical direction Z are configured in the same vertical columns, a method of erasing two sub-memory blocks stacked in the vertical direction Z is exemplified with reference to [Table 4]. For instance, sub-memory blocks that share a source line group or bit lines may be erased simultaneously. A method of simultaneously erasing the first sub-memory block MBa31 of the memory block MB31 and the first sub-memory block MBa21 of the memory block MB21 that share the source line group SLa21 with each other will be exemplified with reference to [Table 4].

Selected (Sel) First Sub-Memory Block MBa11 of Selected Memory Block MB11

The first erase voltage Vera1 may be applied to the source line group SLa11. The first turn-on voltage Vsl1 may be applied to the source selection lines SSL. The first word line voltage $V_{WL1}$ may be applied to the first word line group WL_GRa. The second turn-on voltage Vsl2 may be applied to the drain selection lines DSL. In addition, the second erase voltage Vera2 may be applied to the bit lines BL. The bit lines BL may include BL11 to BL1k and BL21 to BL2k.

More specifically, the first erase voltage Vera1 may be approximately 18V. The second erase voltage Vera2 may be half of the first erase voltage Vera1, or i.e., 9V. The first turn-on voltage Vsl1 may be approximately 15V. The second turn-on voltage Vsl2 may be lower than the first turn-on voltage Vsl1. For instance, the second turn-on voltage Vsl2 may be approximately 2V lower than the second erase voltage Vera2. The first word line voltage $V_{WL1}$ may be 0V wherein 0V may refer to a ground voltage.

When the first erase voltage Vera1 is applied to the source line group SLa11, the first turn-on voltage Vsl1 is applied to the source selection lines SSL. In addition, the first word line voltage $V_{WL1}$ is applied to the first word line group WL_GRa. Further, the erase voltage may be applied to a channel of the first sub-memory block MBa11. Since the second turn-on voltage Vsl2 lower than the second erase voltage Vera2 is applied to the drain selection lines DSL, and the second erase voltage Vera2 is applied to the bit lines BL, the drain selection transistors DST, shown in FIG. 4, may be turned off as a result. If a potential of the channel increases, the source selection lines SSL may be floated. When the potential of the channel increases to the first erase voltage Vera1, the memory cells of the first sub-memory block MBa11 may be erased by a voltage difference of approximately 18V between the memory cells and the channel accordingly.

Selected (Sel) First Sub-Memory Block MBa31 of Selected Memory Block MB31

When the first erase voltage Vera1 is applied to the source line group SLa21, the first turn-on voltage Vsl1 is applied to the source selection lines SSL. In addition, the first word line voltage $V_{WL1}$ may be applied to the first word line group WL_GRa. The second turn-on voltage Vsl2 may also be applied to the drain selection lines DSL. Further, the second erase voltage Vera2 may be applied to the bit lines BL. The bit lines BL may include BL11 to BL1k and BL21 to BL2k.

More specifically, the first erase voltage Vera1 may be approximately 18V. The second erase voltage Vera2 may be half of the first erase voltage Vera1, or i.e., 9V. The first turn-on voltage Vsl1 may be approximately 15V. The second turn-on voltage Vsl2 may be lower than the first turn-on voltage Vsl1. For instance, the second turn-on voltage Vsl2 may be approximately 2V lower than the second erase voltage Vera2. The first word line voltage $V_{WL1}$ may be approximately 0V. The first word line voltage $V_{WL1}$ may be 0V, wherein 0V may refer to a ground voltage.

When the first erase voltage Vera1 is applied to the source line group SLa21, the first turn-on voltage Vsl1 is applied to the source selection lines SSL. Further, the first word line voltage $V_{WL1}$ is applied to the first word line group WL_GRa. In addition, the erase voltage may be applied to a channel of the first sub-memory block MBa31. Since the second turn-on voltage Vsl2 lower than the second erase voltage Vera2 is applied to the drain selection lines DSL, and the second erase voltage Vera2 is applied to the bit lines BL, the drain selection transistors DST, shown in FIG. 4, may be turned off as a result. If a potential of the channel increases, the source selection lines SSL may be floated. When the potential of the channel increases to the first erase voltage Vera1, the memory cells of the first sub-memory block MBa31 may be erased as a result by a voltage difference of approximately 18V between the memory cells and the channel.

Unselected (Un) Second Sub-Memory Block MBb11 of Selected Memory Block MB11

The second erase voltage Vera2 may be applied to the source line group SLa11 and the bit lines BL, the second turn-on voltage Vsl2 may be applied to the source selection lines SSL. In addition, the drain selection lines DSL and the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur as a result between the memory cells and the channel. However, the voltage difference of approximately 9V may nonetheless not cause the memory cells to be erased. When the third word line voltage $V_{WL3}$ of 18V is applied to the second word line group WL_GRb, since no voltage difference occurs between the memory cells and the channel, the memory cells may not be erased as a result even when the potential of the channel increases to approximately 18V.

Since the second erase voltage Vera2 lower than the first erase voltage Vera1 is applied to the bit lines BL and the source line group SLb11 of the unselected second sub-memory block MBb11, power consumption may be reduced during the erase operation accordingly.

Unselected (Un) Second Sub-Memory Block MBb31 of Selected Memory Block MB31

The second erase voltage Vera2 may be applied to the source line group SLa21 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur as a result between the memory cells and the channel. However, the voltage difference of approximately 9V may nevertheless not cause the memory cells to be erased. When the third word line voltage $V_{WL3}$ of 18V is applied to the second word line group WL_GRb, since no voltage difference occurs between the memory cells and the channel, the memory cells may not be erased even when the potential of the channel increases to approximately 18V.

Since the second erase voltage Vera2 lower than the first erase voltage Vera1 is applied to the bit lines B and the source line group SLb21 of the unselected second sub-memory block MBb31, power consumption may be reduced during the erase operation as a result.

Unselected (Un) First Sub-Memory Block MBa21 of Unselected Memory Block MB21

The second erase voltage Vera2 may be applied to the source line group SLa21 and the bit lines BL. The second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be half of the first erase voltage Vera1, or i.e., 9V. The second turn-on voltage Vsl2 may be approximately 2V lower than the second erase voltage Vera2, or i.e. 7V. The first word line voltage $V_{WL}1$ may be 0V, wherein 0V may refer to a ground voltage.

When the second erase voltage Vera2 is applied to the source line group SLa21 and the bit lines BL, the second turn-on voltage Vsl2 is applied to the source selection lines SSL and the drain selection lines DSL. In addition, the first word line voltage $V_{WL1}$ is applied to the first word line group WL_GRa. The second erase voltage Vera2 may also be applied to a channel of the first sub-memory block MBa21. Since the first word line voltage $V_{WL1}$ is applied to the first word line group WL_GRa, a voltage difference of approximately 9V may occur between the memory cells and the channel as a result. However, the voltage difference of approximately 9V may nonetheless not cause the memory cells to be erased.

Since the second erase voltage Vera2 lower than the first erase voltage Vera1 is applied to the source line group SLa21 and the bit lines BL of the unselected first sub-memory block MBa21, power consumption may be reduced during the erase operation accordingly.

Unselected (Un) Second Sub-Memory Block MBb21 of Unselected Memory Block MB21

The second erase voltage Vera2 may be applied to the source line group SLb21 and the bit lines BL. The second turn-on voltage Vsl2 may be applied to the source selection lines SSL and the drain selection lines DSL. Further, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur between the memory cells and the channel as a result. However, the voltage difference of approximately 9V may nonetheless not cause the memory cells to be erased. When the third word line voltage $V_{WL3}$ of 18V is applied to the second word line group WL_GRb, since no voltage difference occurs between the memory cells and the channel, the memory cells may not be erased even when the potential of the channel increases to approximately 18V.

Since the second erase voltage Vera2 lower than the first erase voltage Vera1 is applied to the bit lines BL and the source line group SLb11 of the unselected second sub-memory block MBb21, power consumption may as a result be reduced during the erase operation.

Unselected (Un) First Sub-Memory Block MBa41 of Unselected Memory Block MB41

The second erase voltage Vera2 may be applied to the source line group SLa31 and the bit lines BL, the second turn-on voltage Vsl2 may be applied to the source selection lines SSL and the drain selection lines DSL. In addition, the first word line voltage $V_{WL1}$ may be applied to the first word line group WL_GRa.

More specifically, the second erase voltage Vera2 may be half of the first erase voltage Vera1, or i.e., 9V. The second turn-on voltage Vsl2 may be approximately 2V lower than the second erase voltage Vera2, or i.e. 7V. The first word line voltage $V_{WL1}$ may be 18V or the same as the first erase voltage Vera1. The first word line voltage $V_{WL}1$ may be 0V wherein 0V may refer to a ground voltage.

When the second erase voltage Vera2 is applied to the source line group SLa21 and the bit lines BL, the second turn-on voltage Vsl2 is applied to the source selection lines SSL and the drain selection lines DSL. In addition, the first word line voltage $V_{WL1}$ is applied to the first word line group WL_GRa. The second erase voltage Vera2 may also be applied to a channel of the first sub-memory block MBa31. Since the first word line voltage $V_{WL1}$ is applied to the first word line group WL_GRa, a voltage difference of approximately 9V may occur between the memory cells and the channel as a result. However, the voltage difference of approximately 9V may nevertheless not cause the memory cells to be erased.

Since the second erase voltage Vera2 lower than the first erase voltage Vera1 is applied to the bit lines BL and the source line group SLa31 of the unselected first sub-memory block MBa41, power consumption may accordingly be reduced during the erase operation.

Unselected (Un) Second Sub-Memory Block MBb41 of Unselected Memory Block MB41

The second erase voltage Vera2 may be applied to the source line group SLb31 and the bit lines BL. The second turn-on voltage Vsl2 may be applied to the source selection lines SSL and the drain selection lines DSL. In addition, the second or third word line voltage $V_{WL2}$ or $V_{WL3}$ may be applied to the second word line group WL_GRb.

More specifically, the second erase voltage Vera2 may be half of the first erase voltage Vera1, or i.e., 9V. The second turn-on voltage Vsl2 may be approximately 2V lower than the second erase voltage Vera2, or i.e., 7V. The second word line voltage $V_{WL2}$ may be 9V or the same as the second erase voltage Vera2. The third word line voltage $V_{WL3}$ may be 18V or the same as the first erase voltage Vera1.

For instance, when the second word line voltage $V_{WL2}$ of 9V is applied to the second word line group WL_GRb, and the potential of the channel increases to approximately 18V, a voltage difference of approximately 9V may occur as a result between the memory cells and the channel. However, the voltage difference of approximately 9V may still not cause the memory cells to be erased. When the third word line voltage $V_{WL3}$ of 18V is applied to the second word line group WL_GRb, since no voltage difference occurs between the memory cells and the channel, the memory cells may not be erased even when the potential of the channel increases to approximately 18V.

Since the second erase voltage Vera2 lower than the first erase voltage Vera1 is applied to the bit lines BL and the source line group SLb31 of the unselected second sub-memory block MBb41, power consumption may be reduced during the erase operation as a result.

The remaining unselected memory blocks MB12 to MN44 may be operated in substantially a similar manner as those in the first embodiment as described above.

As described above, although sub-memory blocks do not share a source line group or bit lines with each other, by erasing a plurality of sub-memory blocks simultaneously, a time for an erase operation may be reduced. In addition, power consumption may be reduced during the erase operation.

Figure 8:
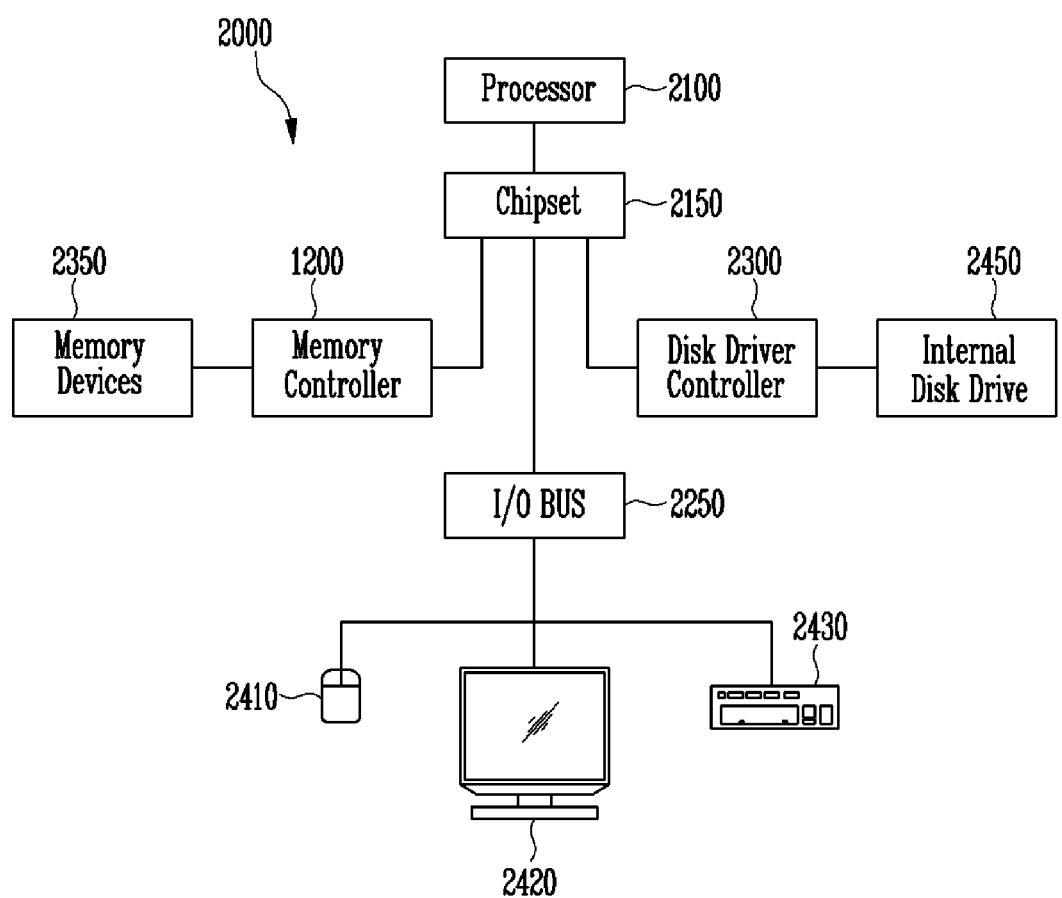
FIG. 8 illustrates a block diagram of a system employing a memory controller circuit in accordance with an embodiment of the invention.

Referring to FIG. 8, a system 2000 may include one or more processors 2100. The processor 2100 may be used individually or in combination with other processors. A chipset 2150 may be electrically coupled to the processor 2100. The chipset 2150 is a communication pathway for signals between the processor 2100 and other components of the system 2000. Other components of the system 2000 may include a memory controller 2200, an input/output ("I/O") bus 2250, and a disk drive controller 2300. Depending on the configuration of the system 2000, any one of a number of different signals may be transmitted through the chipset 2150.

The memory controller 2200 may be operably coupled to the chipset 2150. The memory controller 2200 can receive a request provided from the processor 2100 through the chipset 2150. The memory controller 2200 may be electrically coupled to one or more memory devices 2350. The memory device 2350 may include the semiconductor system 1000 described above.

The chipset 2150 may also be electrically coupled to the I/O bus 2250. The I/O bus 2250 may serve as a communication pathway for signals from the chipset 2150 to I/O devices 2410, 2420 and 2430. The I/O devices 2410, 2420 and 2430 may include a mouse 2410, a video display 2420, or a keyboard 2430. The I/O bus 2250 may employ any one of a number of communications protocols to communicate with the I/O devices 2410, 2420, and 2430.

The disk drive controller 2300 may also be electrically coupled to the chipset 2150. The disk drive controller 2300 may serve as the communication pathway between the chipset 2150 and one or more internal disk drives 2450. The disk drive controller 2300 and the internal disk drives 2450 may communicate with each other or with the chipset 2150 using virtually any type of communication protocol.

As described above, various embodiments have been disclosed in the figures and the specification. The specific terms used herein are for purposes of illustration, and do not limit the scope of the invention defined in the claims. Accordingly, those skilled in the art will appreciate that various modifications and other equivalent examples may be made without departing from the scope and spirit of the disclosure. Therefore, the scope of the invention will be defined by the accompanying claims.

What is claimed is:

1. A semiconductor system, comprising:
    a data storage unit including memory blocks, a circuit group and a control circuit, wherein the memory blocks store data therein and are arranged in a longitudinal direction and a vertical direction, the circuit group is suitable for performing a program, read or erase operation on the memory blocks, and the control circuit controls the circuit group; and
    a memory control unit suitable for controlling the data storage unit,
    wherein each of the memory blocks include a plurality of sub-memory blocks,
    wherein the sub-memory blocks arranged in the longitudinal direction share bit lines and do not share word lines and source lines, and
    the sub-memory blocks arranged in the vertical direction share the bit lines or the source lines.

2. The semiconductor system of claim 1, wherein word lines of some of the sub-memory blocks arranged in the vertical direction, are coupled in common to a first word line group, and word lines of other sub-memory blocks are coupled in common to a second word line group.

3. The semiconductor system of claim 2, wherein the sub-memory blocks coupled to the first word line group and the sub-memory blocks coupled to the second word line group are stacked in vertical columns or in zigzag patterns.

4. The semiconductor system of claim 1, wherein the circuit group comprises:
    a voltage generator suitable for generating voltages including various levels in response to an operation signal;
    a row decoder suitable for transferring the voltages generated by the voltage generator to a selected memory block in response to a row address;
    a column decoder suitable for exchanging data with the selected memory block in response to a column address; and
    an input/output circuit suitable for transferring data, input from exterior, to the column decoder or data, input from the column decoder, to the control circuit or the exterior.

5. A method of operating a semiconductor system, the method comprising:
    during an erase operation of the semiconductor system including memory blocks arranged in a longitudinal direction and a vertical direction and including first sub-memory blocks and second sub-memory blocks,
    increasing a voltage difference between a channel and memory cells of the first sub-memory block of a selected memory block to erase the memory cells included in the first sub-memory block of the selected memory block; and
    reducing a voltage difference between a channel and memory cells of the second sub-memory block of the selected memory block when the memory cells of the first sub-memory block are erased to not erase the memory cells included in the second sub-memory block of the selected memory.

6. The method of claim 5, wherein to erase the memory cells included in the first sub-memory block of the selected memory block, a first erase voltage is applied to a source line group coupled to the first sub-memory block of the selected memory block, a first turn-on voltage is applied to a source selection line, a first word line voltage is applied to word lines, and a second turn-on voltage lower than the first turn-on voltage is applied to a drain selection line, and a second erase voltage lower than the first erase voltage is applied to bit lines.

7. The method of claim 6, wherein the second erase voltage is applied to a source line group coupled to the second sub-memory block of the selected memory block, the second turn-on voltage is applied to a source selection line, a second or third word line voltage higher than the first word line voltage is applied to word lines, the second turn-on voltage is applied to a drain selection line, and the second erase voltage is applied to bit lines to not erase the memory cells included in the second sub-memory block of the selected memory block when the memory cells of the first sub-memory block are erased.

8. The method of claim 6, wherein when the first sub-memory blocks and the second sub-memory blocks of different memory blocks, stacked in the vertical direction, are stacked in zigzag patterns, the first turn-on voltage is applied to a source selection line coupled to the second sub-memory block of a neighboring memory block sharing the source line group of the first sub-memory block included in the selected memory block, a second or third word line voltage is applied to word lines, the second turn-on voltage is applied to a drain selection line, and the second erase voltage is applied to bit lines to not erase memory cells included in the second sub-memory block of the neighboring memory block.

9. The method of claim 8, wherein to not erase memory cells included in the first sub-memory blocks of remaining memory blocks, except the selected memory block, among the selected memory block and the memory blocks stacked in the vertical direction, the second erase voltage is applied to bit lines and source line groups coupled to the first sub-memory blocks of the remaining memory blocks, a second turn-on voltage is applied to source selection lines, the second or the third word line voltage is applied to word lines, and the second turn-on voltage is applied to a drain selection line.

10. The method of claim 8, wherein to not erase memory cells included in the second sub-memory blocks of remaining memory blocks, except the second sub-memory block of the selected memory block and the neighboring memory block, among the selected memory block and the memory blocks stacked in the vertical direction, the second erase voltage is applied to source line groups and bit lines coupled to the second sub-memory blocks of the remaining memory blocks, the second turn-on voltage is applied to source selection lines, the second or third word line voltage is applied to word lines, and the second turn-on voltage is applied to a drain selection line.

11. The method of claim 6, wherein to not erase memory cells included in the first sub-memory block of a neighboring memory block sharing the source line group of the first sub-memory block included in the selected memory block when the first sub-memory blocks of different memory blocks stacked in the vertical direction are stacked on each other, and the second sub-memory blocks of the different memory blocks, stacked in the vertical direction, are stacked on each other, the second turn-on voltage is applied to a source selection line coupled to the first sub-memory block of the neighboring memory block, the first word line voltage is applied to word lines, the second turn-on voltage is applied to a drain selection line, and the second erase voltage is applied to bit lines.

12. The method of claim 11, wherein to not remove memory cells included in the first and second sub-memory blocks of remaining memory blocks, except the first sub-memory blocks of the selected memory block and the neighboring memory block, the second erase voltage is applied to bit lines and source line groups coupled to the first and second sub-memory blocks of the remaining memory blocks, the second turn-on voltage is applied to source selection lines, the first word line voltage is applied to word lines, and the second turn-on voltage is applied to a drain selection line.

13. The method of claim 11, wherein the first turn-on voltage is applied to source selection lines coupled to the first sub-memory block of the neighboring memory block, the first word line voltage is applied to word lines, the second turn-on voltage is applied to drain selection lines, and the second erase voltage is applied to bit lines to erase the memory cells included in the first sub-memory block of the neighboring memory block when the neighboring memory block sharing the source line group of the first sub-memory block, included in the selected memory block, is further selected during the erase operation.

14. The method of claim 11, wherein when another memory block, not sharing the source line group and the bit lines with the first sub-memory block included in the selected memory block, among the selected memory block and the memory blocks stacked in the vertical direction, is further selected during the erase operation, the first turn-on voltage is applied to source selection lines coupled to the first sub-memory block of another memory block, the first word line voltage is applied to word lines, the second turn-on voltage is applied to drain selection lines, and the second erase voltage is applied to bit lines in order to erase memory cells included in the first sub-memory block of another memory block.

15. The method of claim 6, wherein the first erase voltage is 18V, the second erase voltage is 9V, the first turn-on voltage is 15V, the second turn-on voltage is 7V, and the first word line voltage is 0V.

16. The method of claim 7, wherein the second word line voltage is 9V, and the third word line voltage is 18V.

17. A semiconductor system, comprising:
a plurality of memory blocks configured to store data and be arranged in a longitudinal direction and a vertical direction,
wherein each of the plurality of memory blocks include a plurality of sub-memory blocks in which the plurality of sub-memory blocks configured in the longitudinal direction share bit lines and do not share word lines and source lines and the plurality of sub-memory blocks configured in the vertical direction share bit lines or source lines; and
a memory control unit configured to control the plurality of memory blocks.

18. The semiconductor system of claim 17, wherein different voltages are applied to a first source line group and a second source line group.

19. The semiconductor system of claim 17, wherein different voltages are applied to a first word line group and a second word line group.

20. The semiconductor system of claim 17, wherein during an erase operation, different voltages are applied are applied to a first word line group and a second line group in which the first word line group is electrically coupled to first sub-memory blocks and the second word line group is electrically coupled to second sub-memory blocks.

* * * * *